(12) United States Patent
Satou et al.

(10) Patent No.: US 9,022,834 B2
(45) Date of Patent: May 5, 2015

(54) POLISHING SOLUTION FOR CMP AND POLISHING METHOD USING THE POLISHING SOLUTION

(75) Inventors: Eiichi Satou, Hitachi (JP); Munehiro Oota, Hitachi (JP); Kanshi Chinone, Hitachi (JP); Shigeru Nobe, Hitachi (JP); Kazuhiro Enomoto, Hitachi (JP); Tadahiro Kimura, Hitachi (JP); Masato Fukasawa, Hitachi (JP); Masanobu Habiro, Hitachi (JP); Yousuke Hoshi, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 956 days.

(21) Appl. No.: 13/139,117

(22) Filed: Jun. 10, 2011

(65) Prior Publication Data
US 2011/0275285 A1    Nov. 10, 2011

Related U.S. Application Data

(63) Continuation-in-part of application No. PCT/JP2009/070692, filed on Dec. 10, 2009.

(30) Foreign Application Priority Data

Dec. 11, 2008 (JP) ................ P2008-315531
Mar. 26, 2009 (JP) ................ P2009-076520
Apr. 6, 2009 (JP) ................ P2009-092434
Sep. 29, 2009 (JP) ................ P2009-224780

(51) Int. Cl.
*B24B 1/00* (2006.01)
*C09G 1/02* (2006.01)
(Continued)

(52) U.S. Cl.
CPC ............ *H01L 21/31053* (2013.01); *C09G 1/02* (2013.01); *C09K 3/1463* (2013.01)

(58) Field of Classification Search
USPC ............ 451/41, 36, 37; 106/3; 252/79.1, 79.4
See application file for complete search history.

(56) References Cited

U.S. PATENT DOCUMENTS 6,224,464 B1    5/2001    Nojo et al.
6,343,976 B1    2/2002    Yoshida et al.
(Continued)

FOREIGN PATENT DOCUMENTS

CN    1282362 A    1/2001
CN    1906262 A    1/2007
(Continued)

OTHER PUBLICATIONS

Japanese Office Action dated Dec. 3, 2013, corresponding Japanese Application No. 2011-093091.
(Continued)

*Primary Examiner* — Robert Rose
(74) *Attorney, Agent, or Firm* — Westerman, Hattori, Daniels & Adrian, LLP

(57) ABSTRACT

The polishing solution for CMP according to the invention comprises abrasive grains, an additive and water, and the polishing solution comprises an organic compound satisfying specified conditions as the additive. The polishing method of the invention is for polishing of a substrate having a silicon oxide film on the surface, and the polishing method comprises a step of polishing the silicon oxide film with a polishing pad while supplying the polishing solution for CMP between the silicon oxide film and the polishing pad.

22 Claims, 1 Drawing Sheet

(51) Int. Cl.
*H01L 21/3105* (2006.01)
*C09K 3/14* (2006.01)

(56) References Cited

U.S. PATENT DOCUMENTS

| | | | |
|---|---|---|---|
| 6,419,557 | B2 | 7/2002 | Nojo et al. |
| 6,426,294 | B1 | 7/2002 | Hirabayashi et al. |
| 6,527,622 | B1 | 3/2003 | Brusic et al. |
| 6,530,968 | B2 | 3/2003 | Tsuchiya et al. |
| 6,663,468 | B2 | 12/2003 | Kawamura et al. |
| 6,786,945 | B2 | 9/2004 | Machii et al. |
| 6,861,010 | B2 | 3/2005 | Hirabayashi et al. |
| 7,071,105 | B2 | 7/2006 | Carter et al. |
| 7,097,541 | B2 | 8/2006 | DeRege Thesauro et al. |
| 7,115,021 | B2 | 10/2006 | Yoshida et al. |
| 7,288,021 | B2 | 10/2007 | De Rege Thesauro et al. |
| 7,316,603 | B2 | 1/2008 | Carter et al. |
| 7,442,645 | B2 | 10/2008 | Carter et al. |
| 7,776,230 | B2 | 8/2010 | Grumbine et al. |
| 7,871,308 | B2 | 1/2011 | Yoshida et al. |
| 7,963,825 | B2 | 6/2011 | Yoshida et al. |
| 7,998,335 | B2 | 8/2011 | Feeney et al. |
| 8,137,159 | B2 | 3/2012 | Yoshida et al. |
| 8,162,725 | B2 | 4/2012 | Yoshida et al. |
| 8,247,327 | B2 | 8/2012 | De Rege Thesauro et al. |
| 8,277,681 | B2 | 10/2012 | Inada et al. |
| 8,529,680 | B2 | 9/2013 | De Rege Thesauro et al. |
| 8,616,936 | B2 | 12/2013 | Yoshida et al. |
| 8,734,204 | B2 | 5/2014 | Haga et al. |
| 2002/0090895 | A1 | 7/2002 | Yoshida et al. |
| 2004/0048554 | A1 | 3/2004 | Kawamura et al. |
| 2004/0065022 | A1 | 4/2004 | Machii et al. |
| 2004/0152309 | A1 | 8/2004 | Carter et al. |
| 2005/0067378 | A1 | 3/2005 | Fuerhaupter et al. |
| 2005/0148290 | A1 | 7/2005 | De Rege Thesauro et al. |
| 2006/0000808 | A1 | 1/2006 | Seki et al. |
| 2006/0144824 | A1 | 7/2006 | Carter et al. |
| 2006/0196848 | A1 | 9/2006 | Carter et al. |
| 2007/0293048 | A1 | 12/2007 | Lee et al. |
| 2008/0064211 | A1 | 3/2008 | Tsugita et al. |
| 2008/0067679 | A1 | 3/2008 | Takagi et al. |
| 2008/0271383 | A1 | 11/2008 | Yoshida et al. |
| 2009/0029633 | A1 | 1/2009 | Carter et al. |
| 2009/0094901 | A1 | 4/2009 | Shinoda et al. |
| 2009/0203215 | A1 | 8/2009 | Yoshikawa et al. |
| 2009/0209104 | A1 | 8/2009 | Kimura |
| 2009/0221145 | A1 | 9/2009 | Inada et al. |
| 2010/0029181 | A1 | 2/2010 | De Rege Thesauro et al. |
| 2010/0075498 | A1 | 3/2010 | Takagi et al. |
| 2010/0075500 | A1 | 3/2010 | Yoshikawa et al. |
| 2010/0120250 | A1 | 5/2010 | Amanokura et al. |
| 2010/0248486 | A1 | 9/2010 | Nakamura |
| 2010/0276392 | A1 | 11/2010 | Grumbine et al. |
| 2010/0323584 | A1 | 12/2010 | Haga et al. |
| 2011/0104992 | A1 | 5/2011 | Haga et al. |
| 2011/0275217 | A1 | 11/2011 | Satou et al. |
| 2011/0275285 | A1 | 11/2011 | Satou et al. |
| 2012/0280170 | A1 | 11/2012 | De Rege Thesauro et al. |

FOREIGN PATENT DOCUMENTS

| | | |
|---|---|---|
| CN | 101171670 A | 4/2008 |
| CN | 101218378 A | 7/2008 |
| EP | 1 043 379 A1 | 10/2000 |
| EP | 1 369 906 A1 | 12/2003 |
| JP | 03-256665 A | 11/1991 |
| JP | 07-216345 A | 8/1995 |
| JP | 8-22970 A | 1/1996 |
| JP | 08-64594 A | 3/1996 |
| JP | 08-339980 A | 12/1996 |
| JP | 09-137155 A | 5/1997 |
| JP | 11-067765 A | 3/1999 |
| JP | 2868885 B2 | 3/1999 |
| JP | 2000-183003 A | 6/2000 |
| JP | 2001-196337 A | 7/2001 |
| JP | 2002-164308 A | 6/2002 |
| JP | 2003/068683 A | 3/2003 |
| JP | 2003-313542 A | 11/2003 |
| JP | 2004/031443 A | 1/2004 |
| JP | 2004031446 A | 1/2004 |
| JP | 2005-347579 A | 12/2005 |
| JP | 2006-519490 A | 8/2006 |
| JP | 2006-282755 A | 10/2006 |
| JP | 2006-523385 A | 10/2006 |
| JP | 2007-53213 A | 3/2007 |
| JP | 2007-520062 A | 7/2007 |
| JP | 2008-529280 A | 7/2008 |
| JP | 2008-536302 A | 9/2008 |
| JP | 2008/270826 A | 11/2008 |
| JP | 2008-288537 A | 11/2008 |
| JP | 2009-218558 A | 9/2009 |
| JP | 2009-231795 A | 10/2009 |
| JP | 2010-045258 A | 2/2010 |
| TW | 200302267 A | 8/2003 |
| WO | 99-31195 A1 | 6/1999 |
| WO | 02/067309 A1 | 8/2002 |
| WO | 02-067309 A1 | 8/2002 |
| WO | 2007/123235 A1 | 11/2007 |
| WO | 2009/128430 A1 | 10/2009 |

OTHER PUBLICATIONS

Chinese Office Action dated Mar. 5, 2013, issued in corresponding Chinese Patent Application No. 200980148395.7 (5 pages).
Japanese Office Action dated Feb. 25, 2014, issued in corresponding Japanese application No. 2013-044131 (4 pages).
Japanese Office Action dated Feb. 25, 2014, issued in corresponding Japanese application No. 2013-044134 (3 pages).
Japanese Office Action dated May 20, 2014, issued in Japanese Patent Application No. 2011-093091 (2 pages).
Japanese Office Action dated Jan. 15, 2013, issued in corresponding Japanese patent application No. 2010-542124.
Chinese Office Action dated Mar. 6, 2014, issued in corresponding Chinese Application No. 201310241712.8.
Chinese Office Action dated Mar. 6, 2014, issued in corresponding Chinese Application No. 201310241746.7.
Office Action dated Feb. 1, 2013, issued in U.S. Appl. No. 13/102,486; 17 pages.
Taiwanese Office Action dated Mar. 4, 2014, issued in Taiwanese application No. 100115610 (6 pages).
International Search Report of PCT/JP2009/070692, mailing date Jan. 12, 2010.
Honma et al., "Effect of Various Factors on Grinding Using Jet Mill", Department of Chemical Engineering, Yamagata University, Yonezawa 992, 1980, pp. 527-532.
Notification of Transmittal of Translation of the International Preliminary Report on Patentability (Form PCT/IB/338) of International Application No. PCT/JP2009/070692 mailed Jul. 14, 2011 with Forms PCT/IB/373 and PCT/ISA/237.
Notice of Allowance dated Feb. 22, 2013, issued in corresponding Korean Patent Application No. 10-2011-7010783, with English translation (4 pages).
Japanese Office Action dated Oct. 14, 2014, issued in Japanese Application No. 2011-093091; (3 pages).
Japanese Office Action dated Aug. 5, 2014, issued in counterpart Japanese Patent Application No. 2013-044134 (4 pages).

(a)
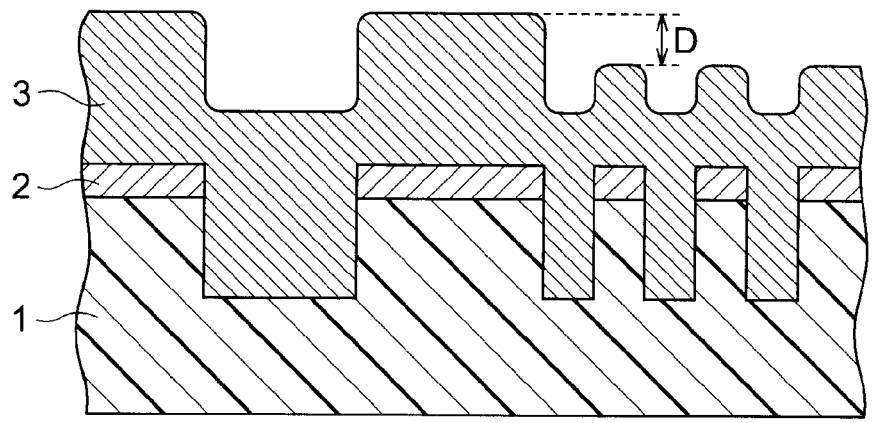
(b)
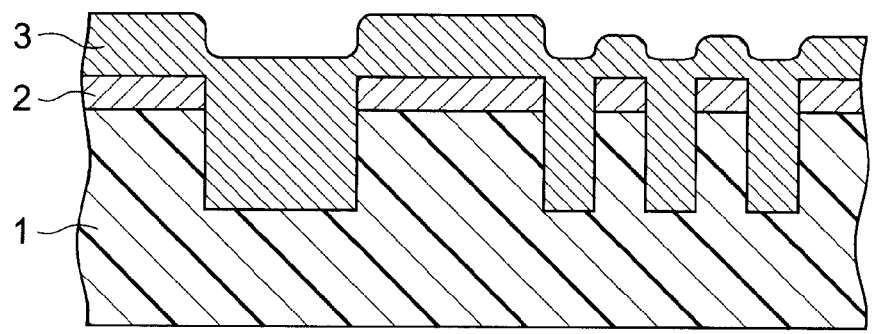
(c)
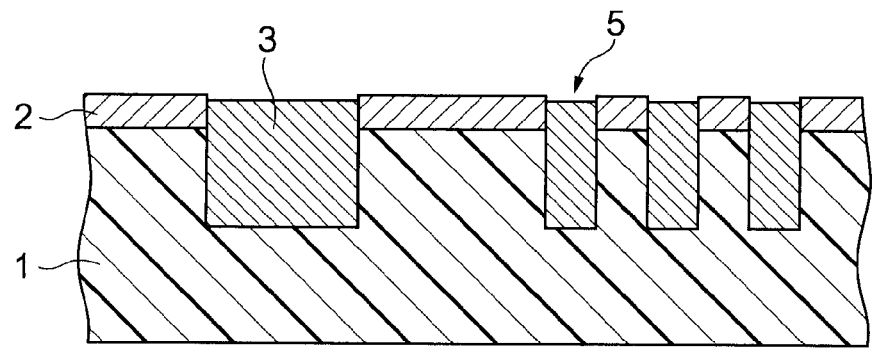

POLISHING SOLUTION FOR CMP AND POLISHING METHOD USING THE POLISHING SOLUTION

CROSS-REFERENCE TO RELATED APPLICATIONS

This is a continuation-in-part application of Ser. No. PCT/JP2009/070692 filed on Dec. 10, 2009.

TECHNICAL FIELD

The present invention relates to a polishing solution to be used for chemical mechanical polishing (CMP) of semiconductor wafer materials. In particular, it relates to a polishing solution for polishing of a silicon oxide film formed on the surface of a semiconductor wafer.

BACKGROUND ART

With the increasingly high performance of super-LSI devices in the field of semiconductor manufacturing, limits are rapidly being reached in terms of both high integration and high speed in techniques of micronization on extension of the prior art. This situation has spurred development of techniques for high integration in the vertical direction as well, i.e. multilayering of wirings, as micronization of semiconductor elements continues to advance.

CMP technique is one of the most important techniques used in processes for production of devices with multilayered wiring. CMP technique is a technique in which a thin-film is formed on a substrate by chemical vapor deposition (CVD) or the like, and then the surface is flattened. For example, CMP treatment is indispensable for ensuring focal depth for lithography. When convexo-concave is present on a substrate surface, inconveniences arise as focusing becomes impossible in the exposure step or fine wiring structures cannot be sufficiently formed. CMP technique is also applied in device manufacturing steps, such as steps of forming device isolation regions by polishing of plasma oxide films (BPSG, HDP-$SiO_2$, p-TEOS), steps of forming interlayer insulating films, or steps of flattening plugs (such as Al or Cu plugs) after embedding silicon oxide-containing films in metal wirings.

CMP is usually carried out using an apparatus that can supply a polishing solution onto a polishing pad. A substrate surface is polished by pressing the substrate against the polishing pad while supplying the polishing solution between the substrate surface and polishing pad. High performance polishing solutions is one of the essential technology for CMP technology, and various polishing solutions have been developed to date (see Patent document 1, for example).

CITATION LIST

Patent Literature

[Patent document 1] Japanese Unexamined Patent Application Publication No. 2008-288537

SUMMARY OF INVENTION

Technical Problem

In a step of forming a device isolation region on a substrate, a groove is first formed in the substrate surface and an insulating film (for example, a silicon oxide film) is formed by CVD or the like to fill the groove. The surface of the insulating film is then flattened by CMP to form the device isolation region. When an insulating film is formed on a substrate of which a device isolation structure such as a groove has been formed on the surface, convexo-concave is are produced in the surface of the insulating film as well, corresponding to the convexo-concave of the device isolation structure. The surface with convexo-concave is flattened by preferentially removing the convex portion while slowly removing the concave portion.

For improved throughput of semiconductor production, it is preferred to remove the undesired sections of the insulating film formed on the substrate, as rapidly as possible. For example, when employing shallow trench isolation (STI) for narrowing of a device isolation region, the undesired portions of the silicon oxide film formed on the substrate as an insulating film must be removed with a high polishing speed.

However, using a CMP polishing solution with a high polishing speed for silicon oxide films generally leaves a rougher polished surface upon completion of polishing, such that the flatness tends to be inferior. Polishing of insulating films is therefore sometimes divided into two stages, using different polishing solutions for each stage, to improve production efficiency. In the first step (rough polishing step), a polishing solution with a high polishing speed for silicon oxide films is used for removal of most of the silicon oxide film. In the second step (finishing step), the silicon oxide film is slowly removed by finishing to a sufficiently flat polished surface.

A high polishing speed for the silicon oxide film is essential in the first step, as mentioned above. It is not possible to achieve a sufficiently high polishing speed in some cases, depending on the condition of the substrate surface, even using the same polishing solution. For example, when polishing a wafer comprising a flat substrate and a flat silicon oxide film formed on the surface of the substrate (silicon oxide film blanket wafer), a high polishing speed for the silicon oxide film can be achieved, but the expected polishing speed cannot be attained for some cases of polishing if the wafer has convexo-concave on the surface. Incidentally, the mechanism by which a silicon oxide film is polished by CMP is still yet to be understood completely, and the cause of this phenomenon is as yet unknown.

Convexo-concave formed on substrate surfaces takes a variety of forms. For example, the widths of convexo-concave, which are dependent on the wiring width, and the convex portion of convexo-concave and the wiring directions differ according to each step and depending on the purpose of the device. Current conventional polishing solutions for CMP, even when they allow satisfactory polishing of certain substrates, are not always able to accomplish comparable polishing of other types of substrates. Particularly when CMP of a silicon oxide film is divided into two or more stages, as mentioned above, a high polishing speed takes precedence over flatness in the first step, and therefore a lower polishing speed results in lower productivity.

It is an object of the present invention to solve this problem, by providing a polishing solution for CMP with high flexibility of use, that can achieve a sufficiently high polishing speed for silicon oxide films while being less dependent on the substrate surface condition compared to conventional polishing solutions, as well as a polishing method using it.

Solution to Problem

The present inventors have conducted much diligent research on additives included in polishing solutions for CMP, with the aim of solving the problem described above.

The present inventors used different organic compounds as additives for preparation of a variety of polishing solutions. These polishing solutions were used for polishing of silicon oxide films, and the polishing speeds were evaluated. As a result, it was found that using a compound having a specific chemical structure as an additive is effective for achieving a high polishing speed, and the present invention has been completed upon this finding.

The polishing solution for CMP according to the invention comprises abrasive grains, an additive and water, the additive comprises one or more compounds that satisfy all of the following conditions i) to v).

i) Having in the molecule one or more cyclic structures including at least one carbon-carbon double bond (C=C). "Carbon-carbon double bond" may include carbon-carbon bonds that form a resonance structure.

ii) Having at least one and not more than four —OH structures in the molecule. "—OH structures" may include the —OH structures in —COOH groups.

iii) Having not more than one —COOH group in the molecule.

iv) Having either or both the following first structure and/or second structure in the molecule.

First structure: A structure comprising a carbon atom $C^1$ and a carbon atom $C^2$ adjacent to the carbon atom $C^1$, wherein an —OH group is bonded to the carbon atom $C^1$, and at least one substituent selected from among —OX, =O, —NX, —NX($C^3$) and —CH=N—OH groups is bonded to the carbon atom $C^2$. Here, X represents a hydrogen atom or a carbon atom, and $C^3$ represents a carbon atom bonded to a nitrogen atom. The bonding forms and bonding atoms of the remaining unshown bonds of the carbon atoms $C^1$, $C^2$ and $C^3$ are optional, and when X is a carbon atom, the bonding forms and bonding atoms of the remaining unshown bonds of X are optional.

Second structure: A structure comprising a carbon atom $C^1$ and a carbon atom $C^2$ adjacent to the carbon atom $C^1$, wherein a —CH=N—OH group is bonded to the carbon atom $C^1$, and a —CH=N—OH group is bonded to the carbon atom $C^2$. The bonding forms and bonding atoms of the remaining unshown bonds of the carbon atoms $C^1$ and $C^2$ are optional.

v) Either or both the carbon atom $C^1$ and/or carbon atom $C^2$ according to condition iv) forms part of the cyclic structures according to condition i), or is bonded to the cyclic structures according to condition i).

The polishing solution for CMP of the invention allows a sufficiently high polishing speed to be achieved for silicon oxide films. Moreover, the high polishing speed can be achieved without significant dependence on the condition of the substrate surface to be polished. While the factors involved in this exhibited effect are not fully understood, it is conjectured that the use of the compound with a specific chemical structure as an additive increases interaction between the polishing solution and the silicon oxide film, resulting in a higher polishing speed.

Thus, since the polishing solution of the invention allows a high polishing speed to be achieved without significant dependence on the condition of the substrate surface, it is suitable for rough polishing of silicon oxide films formed on substrates with convexo-concave. The polishing solution of the invention is also advantageous in that it allows high-speed polishing even using semiconductor materials with which high polishing speeds cannot be easily achieved by conventional polishing solutions. For example, a high polishing speed can be achieved for polishing of silicon oxide films on substrates having sections with the concave portion or convex portion formed in a T-shaped or lattice-shaped fashion when viewed from above, as in the case of semiconductor boards comprising memory cells.

The first structure according to condition iv) is preferably selected from among structures represented by the following formulas a) to m).

[Chemical Formula 1]

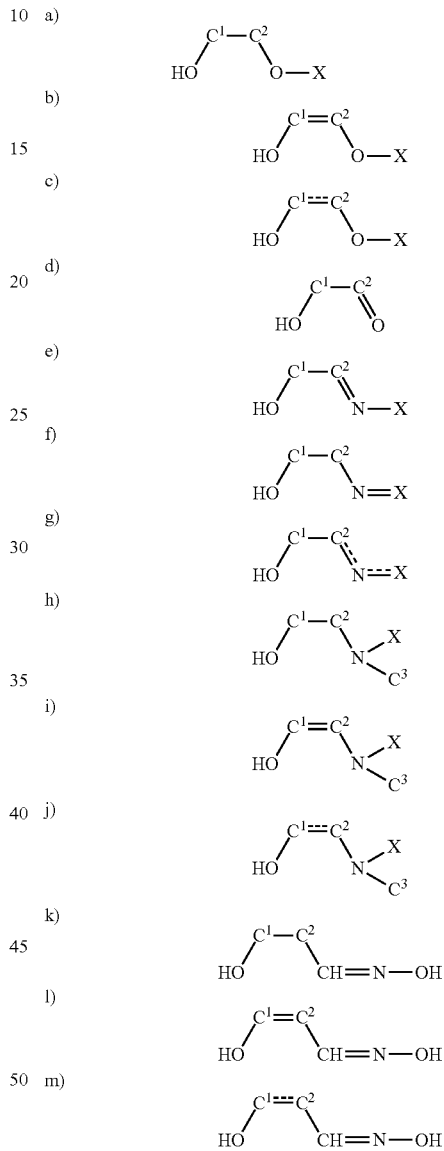

In the formulas, the bonds represented by a pair of solid line and dotted line indicates a bond forming a resonance structure. The bonding forms and bonding atoms of the remaining unshown bonds of the carbon atoms $C^1$, $C^2$ and $C^3$ are optional, and when X is a carbon atom, the bonding forms and bonding atoms of the remaining unshown bonds of X are optional.

By adding a compound with a structure represented by any of formulas a) to m) to the polishing solution, it is possible to achieve even higher polishing speeds for silicon oxide films. Presumably, this is because interaction between the polishing solution and silicon oxide film is further increased by addition of the compound.

The second structure according to condition iv) is preferably selected from among structures represented by the following formulas n) to p).

[Chemical Formula 2]

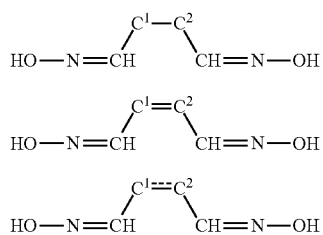

In the formulas, the bonds represented by a pair of solid line and dotted line indicates a bond forming a resonance structure. The bonding forms and bonding atoms of the remaining unshown bonds of the carbon atoms $C^1$ and $C^2$ are optional.

By adding a compound with a structure represented by any of formulas n) to p) to the polishing solution, it is possible to achieve even higher polishing speeds for silicon oxide films. Presumably, this is because interaction between the polishing solution and silicon oxide film is further increased by addition of the compound.

From the viewpoint of achieving an even higher polishing speed for silicon oxide films, the additive preferably comprises one or more compounds selected from the group consisting of uracil-6-carboxylic acid, mandelic acid, salicylaldoxime, ascorbic acid, catechol, 3-methylcatechol, 4-methylcatechol, 4-tert-butyl catechol, 1,4-benzoquinonedioxime, 2-pyridinemethanol, 4-isopropyltropolone, 2-hydroxy-2,4,6-cycloheptatrien-1-one, 5-amino-uracil-6-carboxylic acid and benzylic acid.

The present inventors further conducted periodic measurement of particle sizes to determine the presence or absence of aggregation of abrasive grains in different prepared polishing solutions. As a result it was found that when, among the compounds having the specific chemical structures mentioned above, a 4-pyrone-based compound is included as an additive in the polishing solution, an effect is exhibited which allows aggregation of abrasive grains to be inhibited, in addition to the effects described above. Specifically, from the viewpoint of dispersion stability of the abrasive grains, the polishing solution for CMP of the invention is one comprising abrasive grains, an additive and water, wherein preferably the additive is a 4-pyrone-based compound and the 4-pyrone-based compound is a compound represented by the following formula (I).

[Chemical Formula 3]

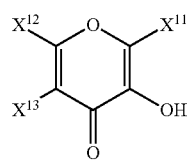

In the formula, $X^{11}$, $X^{12}$ and $X^{13}$ each independently represent hydrogen atom or a monovalent substituent.

A polishing solution comprising a compound represented by formula (1) allows a sufficiently high polishing speed to be achieved for silicon oxide films, while also inhibiting aggregation of abrasive grains. While the factors involved in this exhibited effect are not fully understood, it is conjectured that the use of the 4-pyrone-based compound having a specific structure as an additive increases interaction between the polishing solution and the silicon oxide film, resulting in a higher polishing speed. In addition, it would appear that despite the fact that the 4-pyrone-based compound is an additive that can increase interaction between the polishing solution and silicon oxide film, it has no effect of weakening repulsion such as electrostatic repulsion between the abrasive grains, and can therefore inhibit aggregation of the abrasive grains.

The 4-pyrone-based compound is preferably at least one type of compound selected from the group consisting of 5-hydroxy-2-(hydroxymethyl)-4H-pyran-4-one (alternate name: 5-hydroxy-2-(hydroxymethyl)-4-pyrone), 3-hydroxy-2-methyl-4H-pyran-4-one (alternate name: 3-hydroxy-2-methyl-4-pyrone) and 3-hydroxy-2-ethyl-4H-pyran-4-one (alternate name: 3-hydroxy-2-ethyl-4-pyrone).

The polishing solution of the invention preferably has a pH of below 8. With a pH of below 8, an effect of improved wettability between the polishing solution and silicon oxide film will be exhibited.

The additive content is preferably 0.01-5 parts by mass with respect to 100 parts by mass of the polishing solution. Employing such a construction will allow the polishing speed-improving effect to be even more efficiently obtained.

The abrasive grain content of the polishing solution of the invention is preferably 0.01-10 parts by mass with respect to 100 parts by mass of the polishing solution. The mean particle size of the abrasive grains is preferably 50-500 nm. The abrasive grains preferably comprise a cerium-based compound, and the cerium-based compound is more preferably cerium oxide. The abrasive grains even more preferably comprise polycrystalline cerium oxide having grain boundaries. Employing one or more from among these constructions for the abrasive grains will still further increase the polishing speed for silicon oxide films.

The polishing solution of the invention may further comprise a nonionic surfactant. Employing such a construction will improve the dispersion stability of the abrasive grains in the polishing solution.

The polishing solution of the invention preferably further comprises a saturated monocarboxylic acid as a second additive. Including a saturated monocarboxylic acid can provide advantages, such as increasing the polishing speed for flat semiconductor boards without lowering the polishing speed for semiconductor boards with concavo-convex shapes, or improving the in-plane uniformity, which is an index of variation of the polishing speed in the plane of the wafer.

The number of carbon atoms of the saturated monocarboxylic acid is preferably 2-6. This will increase the polishing speed of flat semiconductor boards and will result in a more satisfactory effect of improved in-plane uniformity. More specifically, the saturated monocarboxylic acid is at least one type of compound selected from the group consisting of acetic acid, propionic acid, butyric acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid and 3,3-dimethylbutanoic acid.

When a saturated monocarboxylic acid is included as a second additive, the saturated monocarboxylic acid content is preferably 0.0001-5 parts by mass with respect to 100 parts by mass of the polishing solution. This will increase the polishing speed on flat semiconductor boards and will allow the effect of improved in-plane uniformity to be more efficiently obtained.

The invention also provides a polishing method using the polishing solution. Specifically, the polishing method of the invention is employed for polishing of a substrate having a silicon oxide film on the surface, and it comprises a step of polishing the silicon oxide film with a polishing pad while supplying the polishing solution between the silicon oxide film and the polishing pad. This polishing method allows a sufficiently high polishing speed to be achieved for silicon oxide films. Since a high polishing speed is achieved without significant dependence on the surface form of the substrate being polished, the polishing method is suitable for rough polishing of silicon oxide films or for polishing of semiconductor boards with memory cells.

Advantageous Effects of Invention

According to the invention there is provided a polishing solution for CMP with high flexibility of use, that can achieve a sufficiently high polishing speed for silicon oxide films while being less dependent on the substrate surface condition compared to conventional polishing solutions. According to the invention there is also provided a polishing method using the polishing solution.

BRIEF DESCRIPTION OF DRAWINGS

FIG. 1 is a schematic cross-sectional view illustrating a procedure in which a silicon oxide film is polished and a shallow trench isolation structure is formed on a semiconductor board.

DESCRIPTION OF EMBODIMENTS

<Polishing Solution for CMP>

The polishing solution for CMP of this embodiment is characterized by comprising abrasive grains (abrasive particles), an additive and water, where the additive is a compound having a specific chemical structure. Each component used for preparation of the polishing solution will now be explained.

(Additive)

The additive (first additive) comprises one or more compounds satisfying all of the following conditions (i) to (v). By using a compound satisfying conditions (i) to (v) as the additive in the polishing solution for CMP of this embodiment, it is possible to achieve a sufficiently high polishing speed for silicon oxide films, with less dependence on the condition of the substrate surface compared to using a conventional polishing solution.

Condition (i) is that of having in the molecule one or more cyclic structures including at least one carbon-carbon double bond. Here, "carbon-carbon double bond" includes not only ordinary double bonds but also carbon-carbon bonds that form a resonance structure. That is, compounds having a resonance structure with delocalized electrons in the molecule, represented by C=C as the chemical formula, are also compounds satisfying condition (i). Specific examples thereof include compounds with benzene rings or pyridine rings. There are no particular restrictions on the type of ring, and it may be a monocyclic compound, condensed-ring compound or crosslinked compound. The cyclic structure may be a carbon ring or a heterocyclic ring. Carbon-carbon double bonds will hereunder also be denoted simply as C=C.

Condition (ii) is that of having at least one and not more than four —OH structures in the molecule. Here, "—OH structure" includes not only the —OH group (hydroxyl group), but also —OH structures contained in substituents other than —OH groups, such as the —OH structure contained in a —COOH group (carboxyl group). So long as the condition of having 1 to 4 —OH structures is satisfied, the structures may be present at any locations in the molecule.

Condition (iii) is that of having not more than one —COOH group (carboxyl group) in the molecule. That is, a compound having no carboxyl group or 1 carboxyl group in the molecule satisfies this condition.

Condition (iv) is that the two adjacent carbon atoms have specific substituents. That is, an —OH group or —CH=N—OH group is bonded as a substituent to one of the carbon atoms. When an —OH group is bonded to one of the carbon atoms, a group —OX, =O, —NX, —NX($C^3$) or —CH=N—OH is bonded to the other carbon atom. Conversely, when a —CH=N—OH group is bonded to one of the carbon atoms, a group —OH or —CH=N—OH is bonded to the other carbon atom.

The aforementioned condition (iv) may be restated as that of having a skeleton of either or both the first structure and/or second structure described below in the molecule.

First structure: A structure comprising a carbon atom $C^1$ and a carbon atom $C^2$ adjacent to the carbon atom $C^1$, wherein an —OH group is bonded to the carbon atom $C^1$, and at least one substituent selected from among —OX, =O, —NX, —NX($C^3$) and —CH=N—OH groups is bonded to the carbon atom $C^2$.

(Here, X represents a hydrogen atom or a carbon atom, and $C^3$ represents a carbon atom bonded to a nitrogen atom. The bonding forms and bonding atoms of the remaining unshown bonds of the carbon atoms $C^1$, $C^2$ and $C^3$ are optional, and when X is a carbon atom, the bonding forms and bonding atoms of the remaining unshown bonds of X are optional. The bonding forms and bonding atoms of N in the —NX group are optional.)

Second structure: A structure comprising a carbon atom $C^1$ and a carbon atom $C^2$ adjacent to the carbon atom $C^1$, wherein a —CH=N—OH group is bonded to the carbon atom $C^1$, and a —CH=N—OH group is bonded to the carbon atom $C^2$.

(The bonding forms and bonding atoms of the remaining unshown bonds of the carbon atoms $C^1$ and $C^2$ are optional.)

The optional bonding forms in the first structure and second structure may be single bonds or double bonds. Examples of optional bonding atoms include hydrogen, oxygen and nitrogen atoms. Bonding between the carbon atom $C^1$ and carbon atom $C^2$ in the first structure and second structure may be a single bond, double bond or triple bond, and the bond may also form a resonance structure. More than one of the first structure and second structure may be present in the molecule.

Specifically, the first structure is preferably selected from among structures represented by the following formulas a) to m).

[Chemical Formula 4]

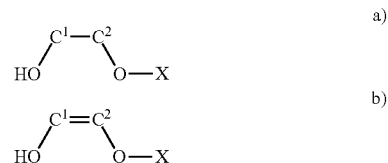

-continued

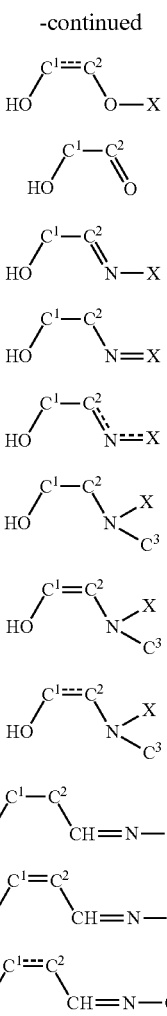

In the formulas, the bond represented by a pair of solid line and dotted line indicates a bond forming a resonance structure. The bonding forms and bonding atoms of the remaining unshown bonds of the carbon atoms $C^1$, $C^2$ and $C^3$ are optional, and when X is a carbon atom, the bonding forms and bonding atoms of the remaining unshown bonds of X are optional.

Specifically, the second structure is preferably selected from among structures represented by the following formulas n) to p).

[Chemical Formula 5]

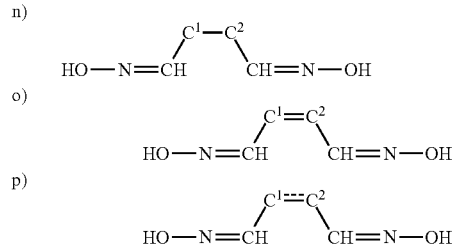

In the formulas, the bond represented by a pair of solid line and dotted line indicates a bond forming a resonance structure. The bonding forms and bonding atoms of the remaining unshown bonds of the carbon atoms $C^1$ and $C^2$ are optional.

Condition (v) is that either or both the carbon atom $C^1$ and/or carbon atom $C^2$ according to condition (iv) forms part of the cyclic structures according to condition (i), or is bonded to the cyclic structures according to condition (i). This condition means that the carbon atom $C^1$ and the carbon atom $C^2$ to which specific substituents are bonded are in a specified positional relationship with the cyclic structure having at least one C=C bond. For example, when a complex compound comprising multiple rings has carbon atoms $C^1$ and $C^2$ satisfying condition (iv) but the positional relationship with the cyclic structure according to condition (i) does not satisfy condition (v), a sufficiently high polishing speed cannot be achieved even when such a compound is used as an additive.

Specific examples of compounds suitable as additives in a polishing solution for CMP satisfying the conditions specified above include uracil-6-carboxylic acid, 5-hydroxy-2-(hydroxymethyl)-4H-pyran-4-one, 3-hydroxy-2-methyl-4H-pyran-4-one, 3-hydroxy-2-ethyl-4H-pyran-4-one, mandelic acid, salicylaldoxime, ascorbic acid, catechol, 4-methylcatechol, 4-tert-butylcatechol, 1,4-benzoquinonedioxime, 2-pyridinemethanol, 4-isopropyltropolone, 2-hydroxy-2,4,6-cycloheptatrien-1-one, 5-amino-uracil-6-carboxylic acid and benzylic acid. These compounds may be used alone, or two or more may be used in combination.

The compounds used as additives are preferably soluble in water. Using a compound with high solubility in water will allow the desired amount of additives to dissolve in the polishing solution, so that an even higher level of the effect of the invention can be obtained. The solubility of the compound is preferably 0.001 g, more preferably 0.005 g, even more preferably 0.01 g and especially preferably 0.05 g, with respect to 100 g of water at ordinary temperature (25° C.). There is no particular restriction for the upper limit of the solubility.

From the viewpoint of obtaining excellent water solubility, the preferred compounds for use as additives are 5-hydroxy-2-(hydroxymethyl)-4H-pyran-4-one, ascorbic acid, salicylaldoxime, catechol, 2-pyridinemethanol and 2-hydroxy-2,4,6-cycloheptatrien-1-one. Even with a compound having a solubility of less than 0.001 g in 100 g of water, solubilization can be achieved by a method such as combining the water with an organic solvent. The organic solvent may be appropriately selected according to the types of compounds used as additives.

The compounds used as additives preferably allow satisfactory maintenance of dispersibility of the abrasive grains in the polishing solution. Satisfactory dispersion stability of the abrasive grains will allow a high polishing speed to be stably maintained for prolonged periods. From this viewpoint, compounds preferred for additives among those mentioned above are uracil-6-carboxylic acid, salicylaldoxime, 1,4-benzoquinonedioxime, 2-pyridinemethanol, 4-isopropyltropolone, 2-hydroxy-2,4,6-cycloheptatrien-1-one and 5-amino-uracil-6-carboxylic acid.

"Satisfactory dispersion stability of the abrasive grains" means a long time in which the abrasive grains are dispersed in the polishing solution, after the abrasive grain concentration has been adjusted to prepare the polishing solution to a usable state. The time is preferably 1 hour or longer, more preferably 3 hours or longer, even more preferably 10 hours or longer and especially preferably 24 hours or longer. However, even when the abrasive grains have settled with the passage of time, redispersion treatment of the abrasive grains will allow CMP to be accomplished using the polishing solution. The dispersibility is evaluated by carrying out dispersion treatment of the polishing solution for 1 minute using an ultrasonic disperser, and measuring the mean particle size of the abrasive grains. The polishing solution is then allowed to stand at room temperature for a prescribed period of time, and the mean particle size of the abrasive grains is again measured. The dispersion stability may be judged to be satisfactory if the change in particle size before and after standing is not greater than ±5%. The method of measuring the mean particle size of the abrasive grains is described below.

The additive (first additive) used is more preferably a 4-pyrone-based compound from among the compounds specified above, from the viewpoint of dispersion stability of the abrasive grains. A 4-pyrone-based compound has a structure with a hydroxy group bonded at least to the carbon atom adjacent to the carbon atom of the carbonyl group. A "4-pyrone-based compound" is a heterocyclic compound comprising an oxy group and a carbonyl group, with a six-membered ring (γ-pyrone ring) structure in which the carbonyl group is located at position 4 with respect to the oxy group. The 4-pyrone-based compound for this embodiment has a hydroxy group bonded to the carbon atom adjacent to the carboxyl group of the γ-pyrone ring, and substituents other than hydrogen atom may substitute on the other carbon atoms.

Such a 4-pyrone-based compound is a compound represented by the following formula (1).

[Chemical Formula 6]

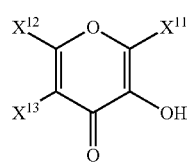

(1)

In the formula, $X^{11}$, $X^{12}$ and $X^{13}$ each independently represent hydrogen atom or a monovalent substituent. As the monovalent substituents there may be mentioned aldehyde, hydroxyl, carboxyl, sulfonate, phosphate, bromine, chlorine, iodine, fluorine, nitro, hydrazine, $C_{1-8}$ alkyl (optionally substituted with OH, COOH, Br, Cl, I or $NO_2$), hydroxyalkyl, $C_{6-12}$ aryl and $C_{1-8}$ alkenyl groups. When the monovalent substituents are present among $X^{11}$, $X^{12}$ and X the substituents are preferably bonded to the carbon atom adjacent to the oxy group, i.e. $X^{11}$ and $X^{12}$ are preferably the substituents. Preferably, at least two among $X^{11}$, $X^{12}$ and $X^{13}$ are hydrogen atom.

Preferred as 4-pyrone-based compounds are one or more compounds selected from the group consisting of 5-hydroxy-2-(hydroxymethyl)-4H-pyran-4-one (alternate name: 5-hydroxy-2-(hydroxymethyl)-4-pyrone), 3-hydroxy-2-methyl-4H-pyran-4-one (alternate name: 3-hydroxy-2-methyl-4-pyrone) and 3-hydroxy-2-ethyl-4H-pyran-4-one (alternate name: 3-hydroxy-2-ethyl-4-pyrone). Any one of these 4-pyrone-based compounds may be used alone, or two or more thereof may be used in combination. When a combination of two or more 4-pyrone-based compounds is used, an effect of greater polishing speed for flat substrates and increased in-plane uniformity will tend to be exhibited.

The 4-pyrone-based compound is preferably water-soluble. Using a compound with high solubility in water will allow the desired amount of additives to satisfactorily dissolve in the polishing solution, so that an even higher level of the effect of increasing the polishing speed and inhibiting aggregation of abrasive grains can be obtained. The solubility of the 4-pyrone-based compound is preferably at least 0.001 g, more preferably at least 0.005 g, even more preferably at least 0.01 g and especially preferably at least 0.05 g, in 100 g of water at ordinary temperature (25° C.). There is no particular restriction for the upper limit of the solubility.

A saturated monocarboxylic acid is preferably further included as a second additive, and more preferably the second additive and the 4-pyrone-based compound are used together. This can increase the polishing speed for wafers without convexo-concave (blanket wafers). In most cases of polishing of wafers with convexo-concave, the convex portion is polished preferentially so that the polished surface is flattened as polishing proceeds, and therefore the polishing speed tends to approach the polishing speed for a blanket wafer. Thus, a polishing solution that is superior not only in terms of the polishing speed for wafers with convexo-concave but also in terms of the polishing speed for wafers without convexo-concave, is suitable from the viewpoint of obtaining a satisfactory polishing speed throughout all of the polishing steps.

From this viewpoint, the saturated monocarboxylic acid is preferably one with 2-6 carbon atoms. Preferred examples include acetic acid, propionic acid, butyric acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid and 3,3-dimethylbutanoic acid. As the saturated monocarboxylic acids there may be used any one of these compounds alone, or two or more thereof in combination. From the standpoint of higher polishing speed, a saturated monocarboxylic acid with 3 or greater carbon atoms is more preferred. From the standpoint of ease of slurry formation due to satisfactory water solubility and the standpoint of availability at low cost, a C2 or C3 saturated monocarboxylic acid is preferred, among which acetic acid and propionic acid are preferred, specifically. Propionic acid is especially preferred from the viewpoint of balance between polishing speed, water solubility and availability.

(Abrasive Grains)

Examples of abrasive grains include particles comprising cerium-based compounds, alumina, silica, titania, zirconia, magnesia, mullite, silicon nitride, α-sialon, aluminum nitride, titanium nitride, silicon carbide, boron carbide and the like. Such particles may be used alone, or two or more may be used in combination. Among these, from the viewpoint of satisfactorily exhibiting the effect of the additives and obtaining a high polishing speed for silicon oxide films, it is preferred to use particles comprising a cerium-based compound.

A polishing solution employing particles comprising a cerium-based compound as the abrasive grains has the feature of producing relatively little polishing damage on polished surfaces. Polishing solutions containing silica particles as abrasive grains have been widely used in the past to more easily achieve high polishing speeds for silicon oxide films. However, polishing solutions employing silica particles also generally tend to create polishing damage on polished surfaces. In devices having fine patterns with wiring widths on the order of 45 nm and smaller, even microscratches that have not conventionally been problematic can tend to affect the reliability of such devices.

Polishing solutions employing particles comprising cerium-based compounds have tended in the past to have somewhat slower polishing speeds for silicon oxide films, compared to those employing silica particles. According to this embodiment, however, a high polishing speed for silicon oxide films is achieved by the combined use of the aforementioned additives with particles comprising a cerium-based compound. This suggests that the combination of a cerium-based compound with the aforementioned additives is particularly effective for polishing.

Examples of cerium-based compounds include cerium oxide, cerium hydroxide, cerium ammonium nitrate, cerium acetate, cerium sulfate hydrate, cerium bromate, cerium bromide, cerium chloride, cerium oxalate, cerium nitrate and cerium carbonate. Among these, cerium oxide particles are preferred for use as abrasive grains. Using cerium oxide particles will allow a high polishing speed to be achieved while also obtaining a polished surface with low damage and excellent flatness.

The cerium oxide used as the abrasive grains preferably includes polycrystalline cerium oxide having multiple crystallites surrounded by grain boundaries. Polycrystalline cerium oxide particles having such a structure differ from simple aggregates of single crystal particles in that they are split by stress during polishing, while active surfaces (surfaces that are not exposed to the exterior before splitting) continually appear, thus presumably allowing a high polishing speed for silicon oxide films to be maintained. Such polycrystalline cerium oxide particles are described in detail in International Patent Publication No. WO99/31195.

There are no particular restrictions on the method for producing the cerium oxide particles, and for example, there may be mentioned methods of liquid phase synthesis, firing or oxidation with hydrogen peroxide or the like. When such polycrystalline cerium oxide with grain boundaries are to be obtained, a method of firing a cerium source such as cerium carbonate is preferred. The temperature during the firing is preferably 350-900° C. When the produced cerium oxide particles have aggregated, they are preferably subjected to mechanical grinding. The grinding method is not particularly restricted, but for example, dry grinding process with a jet mill or a wet grinding process using a planetary bead mill is preferred. The jet mill used may be, for example, the one described in "Kagaku Kougaku Ronbunshu", Vol. 6, No. 5 (1980), p. 527-532.

The mean particle size of the abrasive grains is preferably at least 50 nm, more preferably at least 70 nm and even more preferably at least 80 nm. If the mean particle size is at least 50 nm, it will be possible to increase the polishing speed for silicon oxide films, compared to a mean particle size of less than 50 nm. On the other hand, the mean particle size of the abrasive grains is preferably not greater than 500 nm, more preferably not greater than 300 nm, even more preferably not greater than 280 nm, especially preferably not greater than 250 nm and yet more preferably not greater than 200 nm. If the mean particle size is not greater than 500 nm, it will be possible to better inhibit polishing damage than when it is greater than 500 nm. A publicly known method may be used to control the mean particle size of the abrasive grains, and for cerium oxide particles as an example, there may be used methods such as controlling the firing temperature, firing time and crushing conditions, or filtration, classification or the like.

The mean particle size of the abrasive grains is the median of the volume distribution measured for an abrasive grain-dispersed slurry sample using a dynamic light scattering particle size distribution meter. Specifically, it is the value measured using an LB-500 (trade name) by Horiba, Ltd. or similar device. The slurry sample concentration is adjusted to an abrasive grain content of 0.5 part by mass with respect to 100 parts by mass of slurry sample, and after setting in the LB-500, the median of the volume distribution is measured. By measuring the median diameter (cumulative median) using the LB-500, it is possible to evaluate the degree of abrasive grain aggregation. Measurement of the particle sizes of the abrasive grains in the polishing solution may be accomplished by the same method, after adjusting the slurry sample concentration to an abrasive grain content of 0.5 part by mass with respect to 100 parts by mass of the slurry sample, either by concentrating the polishing solution or diluting it with water.

(Water)

The water used to prepare the polishing solution is not particularly restricted, but deionized water, ion-exchanged water or ultrapure water is preferred. If necessary, a polar solvent such as ethanol, acetic acid or acetone may be used together with the water.

(Other Components)

The polishing solution of this embodiment may contain a surfactant, from the viewpoint of improving the dispersion stability of the abrasive grains and/or the flatness of the polished surface. The surfactant may be an ionic surfactant or nonionic surfactant, but preferably a nonionic surfactant is added.

Examples of nonionic surfactants include ether-type surfactants such as polyoxypropylenepolyoxyethylene alkyl ethers, polyoxyethylene alkyl ethers, polyoxyethylenealkyl alkyl ethers, polyoxyethylenepolyoxypropylene ether derivatives, polyoxypropylene glyceryl ether, polyethylene glycol, methoxypolyethylene glycol and oxyethylene adducts of acetylene-based diols, ester-type surfactants such as sorbitan fatty acid esters and glycerol borate fatty acid esters, amino-ether-type surfactants such as polyoxyethylenealkylamines, ether ester-type surfactants such as polyoxyethylene sorbitan fatty acid esters, polyoxyethyleneglycerol borate fatty acid esters and polyoxyethylene alkyl esters, alkanolamide-type surfactants such as fatty acid alkanolamides and polyoxyethylene fatty acid alkanolamides, as well as oxyethylene adducts of acetylene-based diols, or polyvinylpyrrolidones, polyacrylamides, polydimethylacrylamides, polyvinyl alcohols or the like. These may be used alone, or two or more may be used in combination.

The polishing solution of this embodiment may also contain components other than surfactants, depending on the desired properties. Such components include the pH regulators mentioned below, pH buffering agents to limit variation in pH, aminocarboxylic acids, cyclic monocarboxylic acids, and the like. The addition amounts of these components are preferably within ranges that do not excessively interfere with the aforementioned effect of the polishing agent.

<Polishing Solution Preparation Method and Method of Use>

Polishing solutions may be categorized as (A) normal types, (B) concentrated types and (C) two-solution types, and the method of preparation and method of use will differ depending on the type. The (A) normal types are polishing solutions that can be used directly without pretreatment such as dilution at the time of polishing. The (B) concentrated types are polishing solutions in which the components are more concentrated than in (A) normal types, for convenience of storage and transport. The (C) two-solution types are polishing solutions that, during storage and transport, are kept as a solution A containing specific components and solution B containing other components, the solutions being mixed at the time of use.

The (A) normal types can be obtained by dissolving or dispersing the additives including the specific compounds mentioned above, abrasive grains, and other components as necessary, in water as the main dispersing medium. For example, in order to prepare 1000 g of a polishing solution comprising 0.5 part by mass of abrasive grains and 0.1 part by mass of additives with respect to 100 parts by mass of the polishing solution, the amounts of addition may be adjusted for 5 g of abrasive grains and 1 g of additives in the total polishing solution.

The polishing solution may be prepared using a stirrer, homogenizer, ultrasonic disperser or wet ball mill, for example. The abrasive grains may be subjected to micronization treatment during the polishing solution preparation process so that the mean particle size of the abrasive grains is within the desired range. Micronization treatment of the abrasive grains can be accomplished by precipitating classification or a method using a high-pressure homogenizer. Precipitating classification is a method comprising a step of forcibly precipitating the abrasive grain-containing slurry with a centrifugal separator, and a step of removing out only the supernatant liquid. A method using a high-pressure homogenizer involves impacting together the abrasive grains in the dispersing medium at high pressure.

The first additive content is preferably at least 0.01 part by mass, more preferably at least 0.02 part by mass and even more preferably at least 0.03 part by mass with respect to 100 parts by mass of the polishing solution. If the additive amount is at least 0.01 part by mass, it will be easier to achieve a stabilized polishing speed than when it is less than 0.01 part by mass. On the other hand, the additive content is preferably not greater than 5 parts by mass, more preferably not greater than 3 parts by mass, even more preferably not greater than 1 part by mass and especially preferably not greater than 0.5 part by mass. If the additive amount is not greater than 5 parts by mass, aggregation of the abrasive grains will be inhibited more easily and a higher polishing speed will be achieved, than when it is greater than 5 parts by mass.

When a 4-pyrone-based compound is used as the first additive, the content is preferably at least 0.01 part by mass, more preferably at least 0.02 part by mass and even more preferably at least 0.03 part by mass, with respect to 100 parts by mass of the polishing solution. If the additive amount is at least 0.01 part by mass, it will tend to be easier to achieve a stabilized polishing speed than when it is less than 0.01 part by mass. On the other hand, the additive content is preferably not greater than 5 parts by mass, more preferably not greater than 3 parts by mass, even more preferably not greater than 1 part by mass and especially preferably not greater than 0.5 part by mass. If the additive amount is not greater than 5 parts by mass, aggregation of the abrasive grains will tend to be inhibited more easily and a higher polishing speed will tend to be achieved, than when it is greater than 5 parts by mass.

When a saturated monocarboxylic acid is used as the second additive in the polishing solution, its content is preferably at least 0.0001 part by mass, more preferably at least 0.01 part by mass, even more preferably at least 0.05 part by mass, especially more preferably at least 0.1 part by mass and extremely preferably at least 0.2 part by mass, with respect to 100 parts by mass of the polishing solution. If the second additive amount is at least 0.0001 part by mass, it will tend to be easier to obtain the effect of the saturated monocarboxylic acid, whereby polishing speed is stabilized and the in-plane uniformity is more satisfactory. On the other hand, the second additive content is preferably not greater than 5 parts by mass, more preferably not greater than 3 parts by mass, even more preferably not greater than 2 parts by mass and especially preferably not greater than 1 part by mass. If the second additive amount is not greater than 5 parts by mass, aggregation of the abrasive grains will tend to be inhibited more easily, a higher polishing speed and more satisfactory in-plane uniformity will tend to be achieved, than when it is greater than 5 parts by mass.

The abrasive grain content (particle concentration) is preferably at least 0.1 part by mass, more preferably at least 0.15 part by mass, even more preferably at least 0.2 part by mass and especially preferably at least 0.25 part by mass, with respect to 100 parts by mass of the polishing solution. If the abrasive grain amount is at least 0.1 part by mass, a higher polishing speed will tend to be achieved, than when it is less than 0.1 part by mass. On the other hand, the abrasive grain content is preferably not greater than 10 parts by mass, more preferably not greater than 5.0 parts by mass, even more preferably not greater than 3.0 parts by mass, especially preferably not greater than 2.0 parts by mass and yet more preferably not greater than 1.0 part by mass. If the additive amount is not greater than 10 parts by mass, aggregation of the abrasive grains will tend to be inhibited more easily and a higher polishing speed will tend to be achieved, than when it is greater than 10 parts by mass.

The pH of the polishing solution is preferably not higher than 8.0, more preferably not higher than 7.0, even more preferably not higher than 6.0 and especially preferably not higher than 5.0. If the pH is below 8.0, aggregation of the abrasive grains will be inhibited more easily and the effect of the additives will be obtained more easily, than when it is above 8.0. On the other hand, the pH of the polishing solution is preferably 1.5 or higher, more preferably 2.0 or higher and even more preferably 2.5 or higher. If the pH is 1.5 or higher, a larger absolute value for the zeta potential of the silicon oxide film will be obtainable, than when it is below 1.5.

It would appear that the following two effects are obtained by adjusting the pH of the polishing solution to the range of 1.5-8.0.

(1) The protons or hydroxy anions act on the compounds added as additives, altering the chemical forms of the compounds and improving the wettability or affinity of the substrate surface for the silicon oxide film or the silicon nitride stopper film.

(2) When the abrasive grains are made of cerium oxide, the contact efficiency between the abrasive grains and silicon oxide film is increased and a high polishing speed is achieved. This is because cerium oxide has a positive sign for the zeta potential while the silicon oxide film has a negative sign for the zeta potential, such that electrostatic attraction works between them.

Since the pH of the polishing solution can change depending on the type of compounds used as additives, a pH regulator may be included as an additive to adjust the pH to the range specified above. There are no particular restrictions on pH regulators, and examples include acids such as nitric acid, sulfuric acid, hydrochloric acid, phosphoric acid, boric acid and acetic acid, and bases such as sodium hydroxide, ammonia water, potassium hydroxide and calcium hydroxide. From the viewpoint of increasing productivity, the polishing solution may be prepared without using a pH regulator, and the polishing solution used directly for CMP.

The (B) concentrated types are diluted with water immediately before use to the desired contents of the added components. After dilution, stirring or abrasive grain dispersion treatment may be carried out for any desired period of time until liquid properties (for example, pH or abrasive grain particle size) and polishing properties (for example, silicon oxide film polishing speed or selection ratio with silicon nitride) equivalent to (A) normal types are again exhibited. With (B) concentrated types, the volume is reduced commensurately with the degree of concentration, and it is thus possible to lower storage and transport costs.

The concentration rate is preferably at least 1.5-fold, more preferably at least 2-fold, even more preferably at least 3-fold and especially preferably at least 5-fold. If the concentration rate is at least 1.5-fold, greater advantages for storage and transport can be obtained than when it is less than 1.5-fold. On the other hand, the concentration rate is preferably not greater than 40-fold, more preferably not greater than 20-fold and especially preferably not greater than 15-fold. If the concentration rate is not greater than 40-fold, it will be easier to inhibit aggregation of the abrasive grains than when it is greater than 40-fold.

The caution for use of (B) concentrated types is that the pH changes before and after dilution with water. In order to prepare a polishing solution having the same pH as a (A) normal type from a (B) concentrated type, the pH of the concentrated type polishing solution may be set lower beforehand, in consideration of pH increase by mixture with water. For example, when water dissolving carbon dioxide (pH: approximately 5.6) is used for 10-fold dilution of a (B) concentrated type polishing solution at pH 4.0, the diluted polishing solution will have a pH increased to about 4.3.

The pH of the (B) concentrated type is preferably 1.5-7.0 from the viewpoint of obtaining a polishing solution with an optimal pH after dilution with water. The lower limit for the pH is more preferably 2.0 and even more preferably 2.5. From the viewpoint of inhibiting aggregation of the abrasive grains, the upper limit for the pH is preferably 7.0, more preferably 6.7, even more preferably 6.0 and especially preferably 5.5.

A (C) two-solution type has the advantage of allowing aggregation of the abrasive grains to be avoided than a (B) concentrated type. Any components may be added to solution A and solution B. For example, a slurry comprising abrasive grains and a surfactant or the like added as necessary may be used as solution A, while a solution comprising additives and other components added as necessary may be used as solution B. In this case, the dispersibility of the abrasive grains in solution A may be increased by adding an optional acid or alkali to solution A for adjustment of the pH.

A (C) two-solution type polishing solution is useful when the polishing properties are reduced in a relatively short period of time by aggregation of the abrasive grains, in a state with each of the components mixed. From the viewpoint of reducing costs for storage and transport, either or both solution A and solution B may be concentrated types. In this case, solution A, solution B and water may be mixed when the polishing solution is to be used. The concentration rates and pH values for solution A or solution B may be as desired, so that the final mixture has liquid properties and polishing properties equivalent to those of a (A) normal type polishing solution.

<Polishing Method>

The polishing method of this embodiment employs a polishing solution with adjusted component contents and pH, for flattening of a substrate having a silicon oxide film on the surface using CMP technology. Specifically, it includes a step of supplying a polishing solution according to the embodiment described above between a silicon oxide film of a substrate having the silicon oxide film on the surface, and a prescribed member for polishing (polishing member), and polishing the silicon oxide film by the polishing member.

The polishing method of this embodiment is suitable for polishing of a substrate having a silicon oxide film on the surface, during production of the following devices. Such devices may be, for example, a discrete semiconductor such as a diode, transistor, compound semiconductor, thermistor, varistor or thyristor, a memory element such as DRAM (Dynamic Random Access Memory), SRAM (Static Random Access Memory), EPROM (Erasable Programmable Read-Only Memory), Mask ROM (Mask Read-Only Memory), EEPROM (Electrically Erasable Programmable Read-Only Memory) or Flash Memory, a logic circuit element such as a microprocessor, DSP or ASIC, an integrated circuit element such as a compound semiconductor, an example of which is an MMIC (Monolithic Microwave Integrated Circuit), a hybrid integrated circuit (hybrid IC), or a photoelectric conversion element such as a light emitting diode or charge-coupled element.

The polishing solution of this embodiment can achieve a high polishing speed without significant dependence on the condition of the surface to be polished. Thus, the polishing method using the polishing solution is suitable even for substrates with which it has been difficult to achieve a high polishing speed by methods employing conventional polishing solutions for CMP.

The polishing method of this embodiment is particularly suited for flattening of the surfaces to be polished with step height (convexo-concave) on the surface. Examples of substrates with such surfaces to be polished include logic semiconductor devices. Furthermore, the polishing method is suited for polishing of surfaces containing sections with the concave portion or convex portion in a T-shaped or lattice-shaped fashion when viewed from above. For example, it can accomplish high-speed polishing of silicon oxide films formed on the surfaces of semiconductor devices with memory cells (for example, DRAM or Flash Memory). These have been difficult to polish with a high polishing speed by methods using conventional polishing solutions for CMP, and therefore the CMP polishing solution of the invention can achieve high polishing speeds without significant dependence on the concavo-convex shapes of surfaces to be polished.

The substrates that are suitable for the polishing method are not limited to those wherein the entire substrate surface is formed of a silicon oxide film, and they may also have a silicon nitride film, a polycrystalline silicon film or the like in addition to the silicon oxide film on the substrate surface. The polishing method may also be applied for substrates having an inorganic insulating film of silicon oxide film, glass or silicon nitride or a film composed mainly of polysilicon, Al, Cu, Ti, TiN, W, Ta, TaN or the like on a wiring board with a prescribed wiring.

The method of forming the silicon oxide film on the substrate surface may be low-pressure CVD, plasma CVD or the like. Formation of a silicon oxide film by low-pressure CVD employs monosilane ($SiH_4$) as the Si source and oxygen ($O_2$) as the oxygen source. The $SiH_4$—$O_2$ oxidation reaction is conducted at a low temperature of not higher than 400° C. to form a silicon oxide film. In some cases, heat treatment is carried out at 1000° C. or below after CVD.

Plasma CVD has the advantage of allowing a chemical reaction that requires high temperature at normal thermal equilibrium to take place at low temperature. Plasma generation methods include capacitive coupling and inductive coupling types. The reactive gas may be a $SiH_4$—$N_2O$ gas with $SiH_4$ as the Si source and $N_2O$ as the oxygen source, or a TEOS—$O_2$ gas with tetraethoxysilane (TEOS) as the Si source (TEOS-plasma CVD). The substrate temperature is preferably 250-400° C. and the reaction pressure is preferably 67-400 Pa.

When the silicon oxide film is doped with phosphorus (P) in order to achieve surface flattening with high-temperature reflow, a $SiH_4$—$O_2$—$PH_3$ reactive gas is preferably used. Thus, the silicon oxide film that is to be polished may be doped with an element such as phosphorus or boron.

The silicon nitride film, like the silicon oxide film, may also be formed by low-pressure CVD, plasma CVD or the like. In low-pressure CVD, dichlorsilane ($SiH_2Cl_2$) is used as the Si source, and ammonia ($NH_3$) is used as the nitrogen source. The $SiH_2Cl_2$—$NH_3$ oxidation reaction is conducted at a high temperature of 900° C. to form a silicon nitride film. In plasma CVD, the reactive gas may be a $SiH_4$—$NH_3$ gas with $SiH_4$ as the Si source and $NH_3$ as the nitrogen source. The substrate temperature in this case is preferably 300° C.-400° C.

A process for forming a shallow trench isolation (STI) structure by CMP by the polishing method of this embodiment will now be explained with reference to FIG. 1. The polishing method of this embodiment comprises a first step in which a silicon oxide film 3 is polished at high speed (rough polishing step), and a second step in which the remaining silicon oxide film 3 is polished at a relatively low speed (finishing step).

FIG. 1(a) is a cross-sectional view showing the substrate before polishing. FIG. 1(b) is a cross-sectional view showing the substrate after the first step. FIG. 1(c) is a cross-sectional view showing the substrate after the second step. As seen in these drawings, during the process of forming the STI structure, the partially protruding undesired sections are preferentially removed by CMP to eliminate step height D on the silicon oxide film 3 formed on the silicon substrate 1. In order to halt polishing at an appropriate point when the surface has been flattened, a silicon nitride film 2 with a slow polishing speed (stopper film) is preferably pre-formed under the silicon oxide film 3. The step height D on the silicon oxide film 3 is eliminated by the first and second steps, and a device isolation structure having an embedded section 5 is formed.

For polishing of the silicon oxide film 3, a wafer is placed on the polishing pad, with the upper side of the silicon oxide film 3 contacting the polishing pad, and the surface of the silicon oxide film 3 is polished by the polishing pad. More specifically, the side of the surface to be polished of silicon oxide film 3 is pressed against the polishing pad of a polishing platen, and the silicon oxide film 3 is polished by relative movement between the surface to be polished and the polishing pad while supplying the polishing solution for CMP between the two.

The polishing solution of this embodiment may be used in both the first and second steps, but from the standpoint of achieving a high polishing speed it is especially preferably used in the first step. The example described above assumes polishing in 2 stages, but polishing treatment may also be carried out in a single stage, from the state shown in FIG. 1(a) to the state shown in FIG. 1(c).

The polishing apparatus is preferably an apparatus comprising, for example, a holder which holds the substrate, a polishing platen on which the polishing pad is mounted, and means for supplying the polishing solution on the polishing pad. Examples thereof include polishing apparatuses by Ebara Corp. (Models EPO-111, EPO-222, FREX200 and FREX300), and polishing apparatuses by AMAT Corp. (trade name: Mirra3400, Reflection Polishing Machine). There are no particular restrictions on the polishing pad, and a common nonwoven fabric, foamed polyurethane, porous fluorine resin or the like may be used. The polishing pad is preferably furrowed to allow accumulation of the polishing solution.

There are no particular restrictions on the polishing conditions, but from the viewpoint of avoiding fly-off of the substrate, the rotational speed of the polishing platen is preferably not greater than 200 $min^{-1}$, and the pressure (working load) on the substrate is preferably not greater than 100 kPa from the viewpoint of inhibiting scarring of the polished surface. The polishing solution is preferably continuously supplied to the polishing pad with a pump during polishing. The amount supplied is not particularly restricted, but the surface of the polishing pad is preferably covered by the polishing solution at all times.

Upon completion of polishing, preferably the substrate is thoroughly rinsed in running water, and dried after removing the water droplets adhering to the substrate using a spin dryer or the like. Polishing in this manner allows convexo-concave on the surface to be eliminated, whereby a smooth surface across the entire substrate is obtained. By repeating the steps of film formation and polishing a prescribed number of times, it is possible to produce a substrate having a desired number of layers.

The substrate obtained in this manner may be used as an electronic component. Specific examples include semiconductor elements, optical glass such as photomask, lens and prisms, inorganic conductive films such as ITO, integrated optical circuits, optical switching elements and optical waveguides composed of glass and crystalline materials, end faces of optical fibers, optical single crystals such as scintillators, solid laser single crystals, blue laser LED sapphire substrates, semiconductor single crystals such as SiC, GaP and GaAs, magnetic disk glass panels, magnetic heads, and the like.

EXAMPLES

The present invention will now be explained in greater detail through the following examples, with the understanding that these examples are in no way limitative on the invention.

[Production of Abrasive Grains]

After placing 40 kg of cerium carbonate hydrate in an alumina container, it was fired at 830° C. for 2 hours in air to obtain 20 kg of yellowish white powder. The powder was subjected to phase identification by X-ray diffraction, and it was confirmed that the powder contained polycrystalline cerium oxide. The particle size of the powder obtained by firing was observed by SEM and it was found to be 20-100 μm. Next, 20 kg of cerium oxide powder was subjected to dry grinding using a jet mill. The ground cerium oxide powder was observed by SEM and it was found to contain polycrystalline cerium oxide particles with grain boundaries. The specific surface area was 9.4 $m^2$/g. The specific surface area was measured by the BET method.

[Preparation of Polishing Solution for CMP 1]

In a container there were placed and mixed 15.0 kg of the previously obtained cerium oxide powder and 84.98 kg of deionized water, and then nitric acid was further added to adjust the pH to below 4.5 and the mixture was stirred for 10 minutes. The obtained slurry was conveyed into a separate container over a period of 30 minutes. During that time, the slurry was subjected to ultrasonic irradiation at an ultrasonic frequency of 400 kHz in the tube through which it was conveyed.

A 500 g±20 g portion of slurry was dispensed into each of four 500 mL beakers, and centrifugal separation was performed. The centrifugal separation was performed for 2 minutes under conditions with an outer peripheral centrifugal force of 500 G. The cerium oxide precipitating on the bottom of the beaker was collected. After preparing the slurry concentration to an abrasive grain content of 0.5 mass % based on the total mass of the slurry, the mean particle size of the abrasive grains was measured using a dynamic light scattering particle size distribution meter [trade name: LB-500 by Horiba, Ltd.], and the mean particle size was 150 nm.

Examples 1a-13a Comparative Examples 14a-25a

Polishing solutions for Examples 1a-13a were prepared using compounds I-13 as additives, which satisfied all of conditions (i) to (v) (see Table 1). Polishing solutions for Comparative Examples 14a-25a were prepared using compounds 14-25 as additives, which failed to satisfy some of conditions (i) to (v) (see Table 2).

The columns headed "Compound properties" in Tables 1 and 2 indicate whether or not each of the conditions are satisfied by the compound used as an additive. The symbol "○" in the tables denotes that the compound satisfies the condition, and symbol "x" indicates that it does not satisfy the condition.

Where condition (iv) was satisfied, the relevant structures are selected from chemical formulas (a) to (p) and they are entered, and where multiple structures are present, all are entered. The compounds shown in Table 1 all have a single cyclic structure in the molecule.

The slurry (abrasive grain concentration: 10.0 mass %) was diluted with deionized water to adjust the abrasive grain concentration to 5.0 mass %. Each of the compounds shown in Tables 1 and 2 was added to the solution to a content (based on the total mass of the polishing solution) of 1.0 mass %, and the mixture was stirred for 10 minutes. Next, an ammonia water ($NH_4OH$) pH regulator was added to adjust each of the pH of the polishing solution to the prescribed value (see Tables 1 and 2).

The polishing solutions of Examples 1a-13a obtained in the manner described above were diluted with purified water to an abrasive grain content of 0.5 mass % based on the total mass, to prepare particle size-measuring samples, and the mean particle sizes of the abrasive grains as measured using a dynamic light scattering particle size distribution meter (trade name: LB-500 by Horiba, Ltd.) were all 150±5 nm.

[Evaluation of Properties]

Each of the 23 different polishing solutions prepared in the manner described above was used for polishing of a DRAM device wafer having a silicon oxide film on the surface. The DRAM device wafer has a silicon oxide film with fine convexo-concave, and it has an initial step height of about 600 nm between the convex portion and concave portion. The wiring is formed in a lattice shape with parallel lines, and the silicon oxide film has a concavo-convex shape corresponding to the wiring shape.

(Silicon Oxide Film Polishing 1)

A polishing apparatus (trade name: Mirra3400 by Applied Materials, Inc.) was used for polishing of a DRAM device wafer. The DRAM device wafer was set in a holder equipped with a substrate-mounting adsorption pad. Also, a porous urethane resin polishing pad (k-groove, Model IC-1400 by Rodel) was mounted on a 500 mm-diameter polishing platen.

The holder was placed on the polishing pad with the silicon oxide film-formed side of the DRAM device wafer facing downward. The inner tube pressure, retainer ring pressure and membrane pressure were set to 28 kPa, 38 kPa and 28 kPa, respectively.

While dropping each polishing solution prepared as described above onto the polishing pad attached to the polishing platen at a flow rate of 200 mL/min, the polishing platen and DRAM device wafer were rotated at 93 $min^{-1}$ and 87 $min^{-1}$, respectively, for polishing of the silicon oxide film. Next, the polished wafer was thoroughly cleaned with purified water using a PVA brush (polyvinyl alcohol brush), and then dried.

(Polishing Speed Evaluation 1)

A light-interference film thickness device (trade name: RE-3000 by Dainippon Screen Mfg. Co., Ltd.) was used to measure the change in film thickness of the silicon oxide film before and after polishing, and the polishing speed was calculated from the average change in film thickness. The results are shown in Tables 1 and 2. The units for the polishing speed are Å/min.

TABLE 1

| No. | Compound | Structural formula | Compound properties i) | ii) | iii) | iv) | v) | Polishing solution pH | Polishing speed |
|---|---|---|---|---|---|---|---|---|---|
| 1 | Uracil-6-carboxylic acid | | ○ | ○ | ○ | ○ h) | ○ | 2.5 | 1500 |
| 2 | 5-Hydroxy-2-(hydroxymethyl)-4H-pyran-4-one | | ○ | ○ | ○ | ○ a) b) d) | ○ | 4.8 | 1800 |
| 3 | 3-Hydroxy-2-methyl-4H-pyran-4-one | | ○ | ○ | ○ | ○ b) d) | ○ | 4.8 | 1700 |

TABLE 1-continued

| No. | Compound | Structural formula | Compound properties | | | | | | Polishing solution speed pH | Polishing speed |
|---|---|---|---|---|---|---|---|---|---|---|
| | | | i) | ii) | iii) | iv) | v) | | | |
| 4 | Mandelic acid | | ○ | ○ | ○ | ○ | a) d) | ○ | 3.8 | 1200 |
| 5 | Salicylaldoxime | | ○ | ○ | ○ | ○ | m) | ○ | 5.2 | 1300 |
| 6 | Ascorbic acid | | ○ | ○ | ○ | ○ | a) b) d) | ○ | 3.7 | 1200 |
| 7 | Catechol | | ○ | ○ | ○ | ○ | c) | ○ | 6.5 | 1500 |
| 8 | 4-Methylcatechol | | ○ | ○ | ○ | ○ | c) | ○ | 6.0 | 1500 |
| 9 | 4-tert-Butylcatechol | | ○ | ○ | ○ | ○ | c) | ○ | 6.0 | 1500 |
| 10 | 1,4-Benzoquinonedioxime | | ○ | ○ | ○ | ○ | o) | ○ | 4.9 | 1600 |
| 11 | 2-Pyridinemethanol | | ○ | ○ | ○ | ○ | g) | ○ | 3.5 | 1500 |

TABLE 1-continued

| No. | Compound | Structural formula | Compound properties | | | | | Polishing solution speed pH | Polishing speed |
|---|---|---|---|---|---|---|---|---|---|
| | | | i) | ii) | iii) | iv) | v) | | |
| 12 | 4-Isopropyl tropolone | | ○ | ○ | ○ | ○ | d) | ○ | 4.7 | 1700 |
| 13 | 2-Hydroxy-2,4,6-cycloheptatrien-1-one | | ○ | ○ | ○ | ○ | d) | ○ | 4.9 | 1700 |

TABLE 2

| No. | Compound | Structural formula | Compound properties | | | | | Polishing solution Ph | Polishing speed |
|---|---|---|---|---|---|---|---|---|---|
| | | | i) | ii) | iii) | iv) | v) | | |
| 14 | L-Proline | | x | ○ | ○ | ○ | h) | x | 6.5 | 300 |
| 15 | 2,6-Pyridine-dicarboxylic acid | | ○ | ○ | x | ○ | g) | ○ | 3.0 | 400 |
| 16 | Crotonic acid | | x | ○ | ○ | x | — | x | 4.7 | 200 |
| 17 | Mellitic acid | | ○ | x | x | x | — | ○ | 2.8 | 200 |
| 18 | 3-Methyl-5-pyrazolone | | x | x | ○ | x | — | x | 3.6 | 300 |
| 19 | 1H-Benzotriazole-1-methanol | | ○ | ○ | ○ | x | — | x | 4.3 | 200 |

TABLE 2-continued

| No. | Compound | Structural formula | Compound properties | | | | | Polishing solution Ph | Polishing speed |
| --- | --- | --- | --- | --- | --- | --- | --- | --- | --- |
| | | | i) | ii) | iii) | iv) | v) | | |
| 20 | Thymine | | ○ | x | ○ | x | — | x | 6.0 | 300 |
| 21 | Adenosine | | ○ | ○ | ○ | ○ | a) h) | x | 6.1 | 200 |
| 22 | Syn-2-Nitrobenzaldoxime | | ○ | ○ | ○ | x | — | x | 5.7 | 400 |
| 23 | 3,5-Dihydroxybenzoic acid | | ○ | ○ | ○ | x | — | x | 4.9 | 300 |
| 24 | Lactic acid | | x | ○ | ○ | ○ | a) d) | x | 4.7 | 500 |
| 25 | Tris (2-Hydroxyethyl) isocyanuric acid | | x | ○ | ○ | ○ | h) | x | 4.5 | 300 |

The results shown in Table 1 indicate that the polishing solutions of Examples 1a-13a that used compounds satisfying conditions (i) to (v) as additives allowed polishing of silicon oxide films at a higher speed than the polishing solutions of Comparative Examples 14a-25a.

(Blanket Substrate Polishing)

The polishing speeds were examined with blanket wafers for Examples 2a, 3a, 12a and 13a. Polishing and evaluation were carried out in the same manner as "Silicon oxide film polishing 1" and "Polishing speed evaluation 1" above, except that a blanket wafer having a 10000 Å silicon dioxide film formed on a 200 mm-diameter silicon substrate was exchanged for the DRAM device wafer as the polishing target. As a result, polishing speeds of relative values of 3 or greater were obtained with the polishing solutions of Examples 3a, 12a and 13a, where the polishing speed in Example 2a was defined as 1. This demonstrates that the polishing solutions of Examples 3a, 12a and 13a provided a satisfactory polishing speed even when polishing is accelerated and convexo-concave on the surface to be polished began to disappear.

Preparation of Polishing Solution for CMP 2

Examples 26a-31a

Six polishing solutions with different additive contents were prepared, and the polishing speeds were evaluated in the same manner as the examples described above. Specifically, polishing solutions were prepared in the same manner as Example 6a, except that ascorbic acid was used as an additive, and the additive contents were adjusted to the values listed in Table 3. The polishing solution pH values were adjusted by addition of a suitable amount of ammonia water solution ($NH_4OH$). The results are shown in Table 3. The units for the polishing speed are Å/min.

TABLE 3

| No. | Compound | Additive content/% | Abrasive grain concentration/% | Polishing solution pH | Polishing speed |
|---|---|---|---|---|---|
| 26 | Ascorbic acid | 0.01 | 0.5 | 3.4 | 600 |
| 27 | Ascorbic acid | 0.05 | 0.5 | 3.4 | 1100 |
| 28 | Ascorbic acid | 0.1 | 0.5 | 3.5 | 1200 |
| 29 | Ascorbic acid | 0.5 | 0.5 | 3.4 | 1300 |
| 30 | Ascorbic acid | 1.0 | 0.5 | 3.4 | 1200 |
| 31 | Ascorbic acid | 5.0 | 0.5 | 3.4 | 800 |

The results in Table 3 indicate that it is possible to achieve a high polishing speed for silicon oxide films even when the additive content is varied.

[Preparation of Polishing Solution for CMP 3]

In a container there were placed and mixed 15.0 kg of the previously obtained cerium oxide powder and 84.7 kg of deionized water, and then 0.3 kg of 1N acetic acid was further added and the mixture was stirred for 10 minutes to obtain a cerium oxide mixture. The obtained cerium oxide mixture was conveyed to a separate container over a period of 30 minutes. During that time, the cerium oxide mixture was subjected to ultrasonic irradiation at an ultrasonic frequency of 400 kHz in the tube through which it was conveyed.

A 800 g±8 g portion of the cerium oxide mixture conveyed with ultrasonic irradiation was then divided into four 1000 mL beakers. The cerium oxide mixture in each beaker was subjected to centrifugal separation for 20 minutes under conditions with an outer peripheral centrifugal force of 500 G. After centrifugal separation, the supernatant fraction in the beaker was collected to obtain slurry (A). The obtained slurry (A) contained cerium oxide particles at approximately 10.0 mass % based on the total mass.

Slurry (A) obtained in this manner was then diluted with purified water to an abrasive grain content of 0.5 mass % based on the total mass to obtain a sample for particle size measurement. The mean particle size of the abrasive grains in the sample was measured using a dynamic light scattering particle size distribution meter (trade name: LB-500 by Horiba, Ltd.) and the mean particle size was found to be 150 nm.

Examples 1B-10B

Reference Examples 11B-19B

Polishing solutions for Examples 1b-10b were prepared using the 4-pyrone-based compounds listed in Table 4 as additives. Also, polishing solutions for Reference Examples 11b-19b were prepared using the compounds listed in Table 5 as additives, which are not 4-pyrone-based compounds. The types of additives and other components in each polishing solution were as shown in Tables 4 and 5.

First, each additive listed in Tables 4 and 5 was dissolved in a prescribed amount of deionized water to a final concentration as listed in Tables 4 and 5, to obtain additive solution (B). Next, slurry (A) and additive solution (B) were combined in equal amounts and stirred for 10 minutes. This yielded polishing solution (C) in different concentrated states. The polishing solution (C) in each concentrated state contained abrasive grains at 5 mass % based on the total mass and the additives at 10-fold concentrations with respect to the concentrations listed in Tables 4 and 5.

In addition, each of the polishing solutions (C) in 19 different concentrated states, prepared as described above, was diluted 10-fold, and then 2.5% ammonia water ($NH_4OH$) or 1N dilute nitric acid ($HNO_3$) was added as a pH regulator for adjustment to the pH listed in Table 4 or Table 5, to obtain polishing solutions for Examples 1b-10b and Reference Examples 11b-19b. Because the amount of pH regulator added was trace, the abrasive grain concentration in the obtained polishing solution was 0.5 mass % based on the total mass even after addition of the pH regulator, and the additive concentrations are also the concentrations listed in Tables 4 and 5.

[Evaluation of Properties]

The polishing solutions of Examples 1b-10b and Reference Examples 11b-19b were used for evaluation of their properties in the following manner. Specifically, each polishing solution was used for polishing of a φ200 mm DRAM pattern test wafer (Model: PCW-STI-811 by Praesagus) having a silicon oxide film on the surface. The DRAM device wafer has a silicon oxide film with fine convexo-concave, and it has an initial step height of about 500 nm between the convex portion and concave portion, with an initial silicon oxide film thickness of about 600 nm. The wiring is formed in a lattice shape with parallel lines. Also, for measurement of the ease of aggregation of the polishing solution, polishing solutions 1 hour after preparation and 10 days after preparation, stored at 25° C., were used to measure the mean particle size of the abrasive grains, with a dynamic light scattering particle size distribution meter (trade name: LB-500 by Horiba, Ltd.).

(Silicon Oxide Film Polishing 2)

A polishing apparatus (trade name: Mirra3400 by Applied Materials, Inc.) was used for polishing of a DRAM device wafer. The DRAM device wafer was set in a holder equipped with a substrate-mounting adsorption pad. Also, a porous urethane resin polishing pad (k-groove, Model IC-1400 by Rodel) was mounted on a 500 mm-diameter polishing platen.

The holder was placed on the polishing pad with the silicon oxide film-formed side of the DRAM device wafer facing downward. The inner tube pressure, retainer ring pressure and membrane pressure were set to 28 kPa, 38 kPa and 28 kPa, respectively.

While dropping each polishing solution prepared as described above onto the polishing pad attached to the polishing platen at a flow rate of 200 mL/min, the polishing platen and DRAM device wafer were rotated at 93 $min^{-1}$ and 87 $min^{-1}$, respectively, for polishing of the silicon oxide film. Next, the polished wafer was thoroughly cleaned with purified water using a PVA brush (polyvinyl alcohol brush), and then dried.

(Polishing Speed Evaluation 2)

A light-interference film thickness device (trade name: RE-3000 by Dainippon Screen Mfg. Co., Ltd.) was used to measure the change in film thickness of the silicon oxide film before and after polishing. The measuring points were at the convex portion labeled as "A", which was a 70 μm square near (x[mm], y[mm])=(7.0, −3.6), (31.0, −3.6), (55.0, −3.6), (79.0, −3.6) on the coordinates of the φ200 mm wafer, and the polishing speed was calculated from the average change in film thickness at these 4 points. The obtained results are shown in Tables 4 and 5 as the pattern polishing speed. The units for the polishing speed are nm/min.

(Evaluation of Aggregation Ease)

Measurement of the particle size of the abrasive grains in each of the polishing solutions of Examples 1b-10b and Reference Examples 11b-19b was conducted for two different cases: the polishing solution 1 hour after preparation and the polishing solution 10 days after preparation with storage at 25° C. The particle size measurement was conducted using a dynamic light scattering particle size distribution meter [trade name: LB-500 by Horiba, Ltd.]. For the measurement, the concentrated polishing solution (C) was diluted 10-fold 5 minutes prior to the start of measurement, and the mean particle size of the obtained polishing solution was determined. Since the mean particle size determined for a solution containing no additives was 150 nm, a size exceeding 200 nm may be considered to indicate aggregation of particles, considering measurement error by the apparatus.

TABLE 4

| No. | Additive Name | Additive Structural formula | Additive concentration (mass %) | Abrasive grain concentration (mass %) | Polishing solution pH | Pattern polishing speed (nm/min) | Mean particle size 1 hour after preparation | Mean particle size 10 days after preparation |
|---|---|---|---|---|---|---|---|---|
| 1 | 3-Hydroxy-2-methyl-4-pyrone | 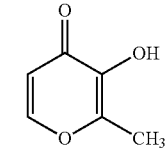 | 0.03 | 0.5 | 4.6 | 130 | 150 | 150 |
| 2 |  |  | 0.08 | 0.5 | 4.6 | 170 | 152 | 155 |
| 3 |  |  | 0.08 | 0.5 | 3.5 | 140 | 153 | 154 |
| 4 |  |  | 0.08 | 0.5 | 6.5 | 180 | 150 | 153 |
| 5 |  |  | 0.08 | 0.5 | 8.5 | 200 | 154 | 155 |
| 6 | 5-Hydroxy-2-(hydroxymethyl)-4-pyrone | 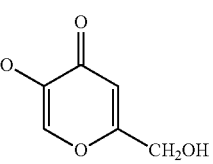 | 0.05 | 0.5 | 4.2 | 150 | 152 | 154 |
| 7 |  |  | 0.1 | 0.5 | 4.2 | 180 | 152 | 152 |
| 8 |  |  | 0.2 | 0.5 | 4.2 | 190 | 153 | 154 |
| 9 |  |  | 0.05 | 0.5 | 3.5 | 130 | 158 | 157 |
| 10 |  |  | 0.05 | 0.5 | 5.5 | 180 | 152 | 154 |

TABLE 5

| No. | Additive Name | Additive Structural formula | Additive concentration (mass %) | Abrasive grain concentration (mass %) | Polishing solution pH | Pattern polishing speed (nm/min) | Mean particle size 1 hour after preparation | Mean particle size 10 days after preparation |
|---|---|---|---|---|---|---|---|---|
| 11 | 4-Hydroxy-6-methyl-2-pyrone | 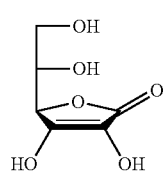 | 0.1 | 0.5 | 4.5 | 20 | 152 | 154 |
| 12 | Ascorbic acid | | 0.1 | 0.5 | 3.7 | 130 | 160 | 1210 |

TABLE 5-continued

| No. | Additive Name | Additive Structural formula | Additive concentration (mass %) | Abrasive grain concentration (mass %) | Polishing solution pH | Pattern polishing speed (nm/min) | Mean particle size 1 hour after preparation | Mean particle size 10 days after preparation |
|---|---|---|---|---|---|---|---|---|
| 13 | Catechol | | 0.1 | 0.5 | 6.5 | 150 | 180 | 1520 |
| 14 | 4-Methyl catechol | | 0.1 | 0.5 | 6 | 150 | 175 | 1450 |
| 15 | Mellitic acid | | 0.1 | 0.5 | 2.8 | 20 | 330 | 2200 |
| 16 | 3-Methyl-5-pyrazolone | | 0.1 | 0.5 | 3.6 | 30 | 153 | 156 |
| 17 | 1H-Benzotriazole-1-methanol | | 0.1 | 0.5 | 4.3 | 20 | 152 | 154 |
| 18 | 2,6-Pyridine-dicarboxylic acid | | 0.1 | 0.5 | 3.0 | 40 | 250 | 1570 |
| 19 | Adenosine | | 0.1 | 0.5 | 6.1 | 20 | 153 | 154 |

According to the results in Table 4, the polishing solutions of Examples 1b-10b which employed 4-pyrone-based compounds as additives allowed polishing of silicon oxide films at higher speeds than the polishing solutions of Reference Examples 11b-19b, and no aggregation of abrasive grains was seen (particle size change within ±5%) even in the polishing solution 10 days after preparation.

Preparation of Polishing Solutions for CMP 4

Examples 20b-29b

The polishing solutions of Examples 20b-29b were each prepared using the components listed as Nos. 20-29 in Table 6. Specifically, the polishing solutions of Examples 20b-22b and 26b contained only a 4-pyrone-based compound as an additive (first additive), while the polishing solutions of Examples 23b-25b and 27b-29b further contained a saturated monocarboxylic acid as a second additive in addition to the 4-pyrone-based compound as the first additive. The types of additives and other components in each polishing solution were as shown in Table 6. The polishing solutions of Examples 20b-29b were prepared in the same manner as "Preparation of polishing solution for CMP 3" described above.
[Evaluation of Properties]
The polishing solutions of Examples 20b-29b were used for evaluation of the properties in the following manner.
Specifically, the pattern polishing speed was measured first, by the same method as "Silicon oxide film polishing 2" described above. Also, except that a ϕ200 mm blanket wafer having a silicon oxide film with an initial film thickness of approximately 1000 nm (product of Advantech, Inc.) was used instead of a DRAM device wafer, and the measuring points were the center point of the wafer and the points at 5 mm intervals from the center point in the diameter direction, for a total of 41 points (the next measuring point from the measuring point 95 mm from the center was at a location 97 mm from the center), the change in film thickness was determined at the 41 points by the same method as in "Polishing speed evaluation 2", taking the average as the non-pattern polishing speed. The value of the standard deviation of the change in film thickness divided by the average value of the change in film thickness and multiplied by 100 was determined and used as the in-plane uniformity. The results are shown in Table 6. In Table 6, the first additive A is 3-hydroxy-2-methyl-4-pyrone, and B is 5-hydroxy-2-(hydroxymethyl)-4-pyrone.

TABLE 6

| No. | First additive concentration (mass %) A | B | Second additive | Second additive concentration (mass %) | Abrasive grain concentration (mass %) | pH | Pattern polishing speed (nm/min) | No pattern polishing speed (nm/min) | In-plane uniformity (%) |
|---|---|---|---|---|---|---|---|---|---|
| 20 | 0 | 0.15 | None | 0 | 0.5 | 4.2 | 180 | 210 | 5.1 |
| 21 | 0.085 | 0 | None | 0 | 0.5 | 4.6 | 170 | 680 | 15.8 |
| 22 | 0.043 | 0.075 | None | 0 | 0.5 | 4.3 | 170 | 370 | 9.7 |
| 23 | 0.043 | 0.075 | Acetic acid | 0.5 | 0.5 | 3.3 | 170 | 470 | 4.2 |
| 24 | 0.043 | 0.075 | Propionic acid | 0.5 | 0.5 | 3.3 | 180 | 510 | 3.9 |
| 25 | 0.043 | 0.075 | Formic acid | 0.5 | 0.5 | 4.0 | 170 | 170 | 9.5 |
| 26 | 0.068 | 0.03 | None | 0 | 0.5 | 4.3 | 190 | 430 | 4.9 |
| 27 | 0.068 | 0.03 | Acetic acid | 0.5 | 0.5 | 3.3 | 190 | 550 | 4.6 |
| 28 | 0.068 | 0.03 | Propionic acid | 0.5 | 0.5 | 3.3 | 190 | 590 | 7.1 |
| 29 | 0.068 | 0.03 | Butyric acid | 0.5 | 0.5 | 3.3 | 190 | 530 | 3.7 |

As shown in Table 6, the polishing solutions of Examples 20b and 21b which contained only one type of 4-pyrone-based compound both exhibited excellent pattern polishing speeds. It was also demonstrated that the polishing solutions of Examples 22b and 26b which contained a combination of two different 4-pyrone-based compounds exhibit excellent pattern polishing speeds, and also exhibiting a positive effect in terms of non-pattern polishing speed and in-plane uniformity.

It was further shown that a system, to which the C2-6 saturated monocarboxylic acids such as acetic acid, propionic acid and butyric acid have been added as second additives, are particularly effective for increasing the non-pattern polishing speed as in Examples 23b-25b and Examples 27b-29b. In most cases of polishing of wafers with convexo-concave, the convex portion is polished preferentially so that the polished surface is flattened as polishing proceeds, and therefore the polishing speed tends to approach the polishing speed for a blanket wafer. Thus, a polishing solution that is excellent in terms of not only pattern polishing speed but also non-pattern polishing speed, is desirable for obtaining a satisfactory polishing speed throughout the entire polishing process. Furthermore, the results described above indicate that addition of a C2-6 saturated monocarboxylic acid as a second additive is particularly effective since such an effect is exhibited.

[Evaluation of Properties 2]

The polishing solutions of Examples 28b and 30b were used to confirm the effect of improving the flattening property by addition of a surfactant. This effect was evaluated based on in-plane uniformity. The results are shown in Table 7. In Table 7, the first additive A is 3-hydroxy-2-methyl-4-pyrone, and B is 5-hydroxy-2-(hydroxymethyl)-4-pyrone.

TABLE 7

| No | First additive concentration (mass %) A | First additive concentration (mass %) B | Second additive | Second additive concentration (mass %) | Surfactant | Surfactant concentration (mass %) | pH | Pattern polishing speed (nm/min) | No pattern polishing speed (nm/min) | In-plane uniformity (%) |
|---|---|---|---|---|---|---|---|---|---|---|
| 28 | 0.068 | 0.03 | Propionic acid | 0.5 | None | 0 | 3.3 | 190 | 590 | 7.1 |
| 30 | 0.068 | 0.03 | Propionic acid | 0.5 | Polyoxy-ethylene Sorbitan monolaurate | 0.02 | 3.3 | 180 | 560 | 3.2 |

As seen in Table 7, addition of a surfactant clearly improved the in-plane uniformity. A surfactant generally protects the concave portion where polishing pressure is not exerted, and inhibits polishing. It therefore acts to promote uniform progression of polishing at irregular sections, which are affected differently by application of pressure. Addition of a surfactant is preferred for improving the flattening property.

In the present specification, the present inventors have described preferred modes for carrying out the invention. Similar preferred modifications will also be readily apparent to a person skilled in the art from the description related herein. The present inventors are also well aware of different modes of the invention or inventions of similar form that apply the core principle of the invention. In addition, the invention includes, in principle, all modified forms of the content described in the Claims, and any desired combination of such elements may be employed. All possible combinations thereof are encompassed by the invention, unless otherwise specified in the present specification or unless specifically negated by context.

INDUSTRIAL APPLICABILITY

According to the invention there is provided a polishing solution for CMP with high flexibility of use, that can achieve a sufficiently high polishing speed for silicon oxide films while being less dependent on the substrate surface condition compared to conventional polishing solutions. According to the invention there is also provided a polishing method using the polishing solution.

EXPLANATION OF SYMBOLS

1: Silicon substrate, 2: stopper film (silicon nitride film), 3: silicon oxide film, 5: embedded section, D: difference in height of silicon oxide film thickness (step height).

The invention claimed is:

1. A method of polishing a substrate having a silicon oxide film on a surface, the method comprising
   a step of polishing the silicon oxide film with a polishing pad while supplying a polishing solution between the silicon oxide film and the polishing pad,
   the polishing solution comprising abrasive grains, an additive and water, the additive comprising one or more compounds that each satisfy all of the following conditions i) to v):
   i) said one or more compounds comprise one or more cyclic structures comprising at least one carbon-carbon double bond, wherein the carbon-carbon double bond may include carbon-carbon bonds that form a resonance structure;
   ii) said one or more compounds comprise at least one and not more than four —OH structures, wherein the —OH structures may be a —COOH group;
   iii) said one or more compounds comprise not more than one —COOH group;
   iv) said one or more compounds comprise either or both of a first structure and a second structure;
   wherein the first structure comprises a carbon atom $C^1$ and a carbon atom $C^2$ bonded to $C^1$, an —OH group bonded to the carbon atom $C^1$, and at least one substituent selected from —OX, =O, —NX, —NX($C^3$) and —CH=N—OH groups bonded to the carbon atom $C^2$, where X represents a hydrogen atom or a carbon atom and $C^3$ represents a carbon atom bonded to a nitrogen atom, wherein $C^1$, $C^2$ and $C^3$ may be substituted, and when X is a carbon atom, X may be substituted;
   wherein the second structure according to condition iv) is at least one selected from the group consisting of formulas n) to p)

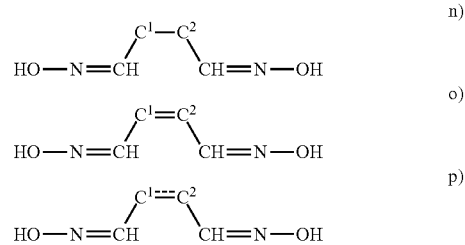

wherein, in the formulas n) to p), the bond represented by a pair of solid line and dotted line indicates a bond forming a resonance structure and the carbon atoms $C^1$ and $C^2$ may be substituted; and
   v) either or both the carbon atom $C^1$ and the carbon atom $C^2$ according to condition iv) forms part of the cyclic structures according to condition i), or is bonded to the cyclic structures according to condition i).

2. A method of polishing a substrate having a silicon oxide film on a surface, the method comprising
   a step of polishing the silicon oxide film with a polishing pad while supplying a polishing solution between the silicon oxide film and the polishing pad,
   wherein the polishing solution comprises abrasive grains, an additive and water, the additive comprising one or more compounds that each satisfy all of the following conditions i) to v):
   i) said one or more compounds comprise one or more cyclic structures comprising at least one carbon-carbon double bond, wherein the carbon-carbon double bond may include carbon-carbon bonds that form a resonance structure;

ii) said one or more compounds comprise at least one and not more than four —OH structures, wherein the —OH structures may be a —COOH group;

iii) said one or more compounds comprise not more than one —COOH group;

iv) said one or more compounds comprise either or both of a first structure and a second structure;

wherein the first structure is at least one selected from the group consisting of formulae e) to m);

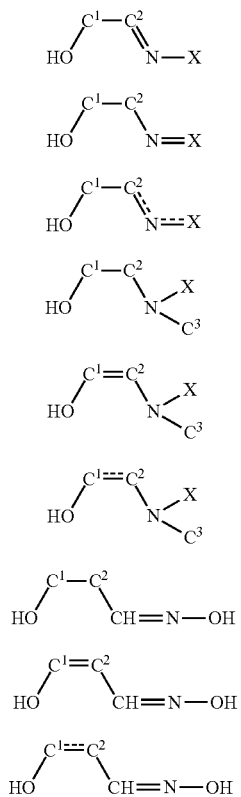

wherein the carbon atoms $C^1$ and $C^2$ may be substituted;

wherein the second structure comprises a carbon atom $C^1$ and a carbon atom $C^2$ bonded to each other, a —CH=N—OH group bonded to the carbon atom $C^1$ and a —CH=N—OH group bonded to the carbon atom $C^2$, wherein the carbon atoms $C^1$ and $C^2$ may be substituted; and v) either or both the carbon atom $C^1$ and the carbon atom $C^2$ according to condition iv) forms part of the cyclic structures according to condition i), or is bonded to the cyclic structures according to condition i).

3. The method of polishing according to claim 2, wherein the substrate is a substrate having sections with a concave portion or a convex portion formed in a T-shaped or lattice-shaped fashion when viewed from above.

4. The method of polishing according to claim 2, wherein the substrate is a semiconductor board with a memory cell.

5. The method of polishing according to claim 2, wherein the second structure according to condition iv) is at least one selected from the group consisting of formulas n) to p)

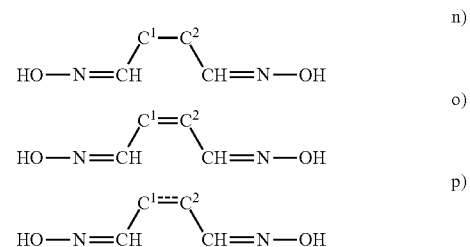

wherein, in the formulas n) to p), the bond represented by a pair of solid line and dotted line indicates a bond forming a resonance structure and the carbon atoms $C^1$ and $C^2$ may be substituted.

6. A polishing solution for CMP comprising abrasive grains, an additive and water, the additive comprising one or more compounds that each satisfy all of the following conditions i) to v):

i) said one or more compounds comprise one or more cyclic structures comprising at least one carbon-carbon double bond, wherein the carbon-carbon double bond may include carbon-carbon bonds that form a resonance structure;

ii) said one or more compounds comprise at least one and not more than four —OH structures, wherein the —OH structures may be a —COOH group;

iii) said one or more compounds comprise not more than one —COOH group;

iv) said one or more compounds comprise either or both of a first structure and a second structure;

wherein the first structure comprises a carbon atom $C^1$ and a carbon atom $C^2$ bonded to $C^1$, an —OH group bonded to the carbon atom $C^1$, and at least one substituent selected from —OX, =O, —NX, —NX($C^3$) and —CH=N—OH groups bonded to the carbon atom $C^2$, where X represents a hydrogen atom or a carbon atom and $C^3$ represents a carbon atom bonded to a nitrogen atom, wherein $C^1$, $C^2$ and $C^3$ may be substituted, and when X is a carbon atom, X may be substituted;

wherein the second structure according to condition iv) is at least one selected from the group consisting of formulas n) to p)

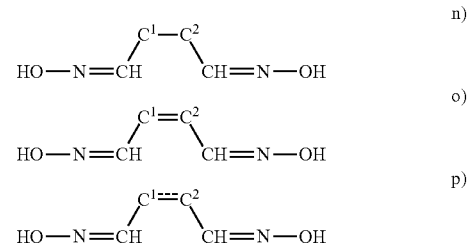

wherein, in the formulas n) to p), the bond represented by a pair of solid line and dotted line indicates a bond forming a resonance structure and the carbon atoms $C^1$ and $C^2$ may be substituted; and v) either or both the carbon atom $C^1$ and the carbon atom $C^2$ according to condition iv) forms part of the cyclic structures according to condition i), or is bonded to the cyclic structures according to condition i).

7. The method of polishing according to claim 2, wherein the additive comprises one or more compounds selected from the group consisting of uracil-6-carboxylic acid, mandelic acid, salicylaldoxime, ascorbic acid, catechol, 3-methylcatechol, 4-methylcatechol, 4-tert-butylcatechol, 1,4-benzoquinonedioxime, 2-pyridinemethanol, 4-isopropyltropolone, 2-hydroxy-2,4,6-cycloheptatrien-1-one, 5-amino-uracil-6-carboxylic acid and benzylic acid.

8. A method of polishing a substrate having a silicon oxide film on a surface,
the method comprising a step of polishing the silicon oxide film with a polishing pad while supplying a polishing solution for CMP comprising abrasive grains, an additive and water,
wherein the additive is a 4-pyrone-based compound and the 4-pyrone-based compound is a compound represented by the following formula (1)

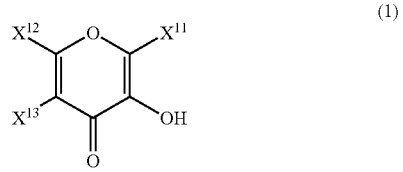

wherein in the formula, $X^{11}$, $X^{12}$ and $X^{13}$ each independently represent hydrogen atom or a monovalent substituent.

9. The method of polishing according to claim 8, wherein the 4-pyrone-based compound is at least one type of compound selected from the group consisting of 3-hydroxy-2-methyl-4-pyrone, 5-hydroxy-2-(hydroxymethyl)-4-pyrone and 2-ethyl-3-hydroxy -4-pyrone.

10. The method of polishing according to claim 2, wherein a pH is below 8.

11. The method of polishing according to claim 2, further comprising a pH regulator.

12. The method of polishing according to claim 2, wherein an additive content is 0.01-5 parts by mass with respect to 100 parts by mass of the polishing solution.

13. The method of polishing according to claim 2, wherein an abrasive grain content is 0.01-10 parts by mass with respect to 100 parts by mass of the polishing solution.

14. The method of polishing according to claim 2, wherein a mean particle size of the abrasive grains is 50-500 nm.

15. The method of polishing according to claim 2, wherein the abrasive grains comprise a cerium-based compound.

16. The method of polishing according to claim 15, wherein the cerium-based compound is cerium oxide.

17. The method of polishing according to claim 2, wherein the abrasive grains comprise polycrystalline cerium oxide with grain boundaries.

18. The method of polishing according to claim 2, further comprising a nonionic surfactant.

19. The method of polishing according to claim 2, further comprising a saturated monocarboxylic acid as a second additive.

20. The method of polishing solution according to claim 19, wherein the number of carbon atoms of the saturated monocarboxylic acid is 2-6.

21. The method of polishing according to claim 19, wherein the saturated monocarboxylic acid is at least one of compound selected from the group consisting of acetic acid, propionic acid, butyric acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid and 3,3-dimethylbutanoic acid.

22. The method of polishing according to claim 19, wherein a saturated monocarboxylic acid content is 0.0001-5 parts by mass with respect to 100 parts by mass of the polishing solution.

* * * * *